US012701884B2

(12) United States Patent
Xi et al.

(10) Patent No.: US 12,701,884 B2
(45) Date of Patent: Aug. 4, 2026

(54) SUB-PIXEL ARRANGEMENTS FOR PIXEL RENDERING IN LED-BASED DISPLAY PANELS

(71) Applicant: Intel Corporation, Santa Clara, CA (US)

(72) Inventors: Peng-Bo Xi, Zhubei City (TW); Yi-chuan Liu, Zhubei City (TW); Jackson Tsai, Taipei City (TW)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 17/856,570

(22) Filed: Jul. 1, 2022

(65) Prior Publication Data

US 2022/0336544 A1      Oct. 20, 2022

(51) Int. Cl.
H10K 59/35 (2023.01)
H10K 59/38 (2023.01)

(52) U.S. Cl.
CPC ......... H10K 59/353 (2023.02); H10K 59/352 (2023.02); H10K 59/38 (2023.02)

(58) Field of Classification Search
CPC .... H10K 59/353; H10K 59/352; H10K 59/38; H10K 59/351
See application file for complete search history.

(56) References Cited

U.S. PATENT DOCUMENTS

2022/0190058 A1* 6/2022 Noh ...................... H10K 59/353
2022/0310704 A1* 9/2022 Wang ................... H10K 59/353

OTHER PUBLICATIONS

"PenTile," Phone Scoop; accessed Jul. 6, 2022; retrieved from https://www.phonescoop.com/glossary/term.php?gid=489; 2 pages.
"Understanding the Pentile RG/BW Subpixel Layout", accessed Jul. 6, 2022; http://www.clivemaxfield.com/area51/do-not-delete/pentile-rgbw-demo.html, 2 pages.
"PenTile Matrix Family." Wikipedia, accessed Jul. 6, 2022; https://en.wikipedia.org/w/index.php?title=PenTile_matrix_family&oldid=1095048752, 9 pages.

* cited by examiner

*Primary Examiner* — Anne M Hines
*Assistant Examiner* — Jose M Diaz
(74) *Attorney, Agent, or Firm* — Alliance IP, LLC

(57)        ABSTRACT

In one embodiment, a display includes alternating first and second pixel types. The first pixel type may include a first sub-pixel to emit neutral light (e.g., substantially white light), a second sub-pixel to emit a first color (e.g., substantially green) light, and a third sub-pixel to emit a second (e.g., substantially red) light. The second pixel type may include a first sub-pixel to emit neutral (e.g., substantially white) light, a second sub-pixel to emit a third (e.g., substantially blue) light, and a third sub-pixel to emit the second (e.g., substantially red) light.

24 Claims, 33 Drawing Sheets

Zone C (cyan) = W + G + B

Zone C (cyan) = W + G + B

Zone Y (yellow) = W + G + R

Zone M (magenta) = W + B + R

White point = W

Zone C (cyan) = W + G + B

Zone Y (yellow) = W + G + R

Zone M (magenta) = W + B + R

Zone M (magenta) = W + B + R

Zone 1 = W + R + G

Zone 2 = W + R + B

Zone 3 = W + C + G

Zone 4 = W + C + B

Zone 4 = W + C + B

SUB-PIXEL ARRANGEMENTS FOR PIXEL RENDERING IN LED-BASED DISPLAY PANELS

BACKGROUND

Current display panels may incorporate various sub-pixel arrangements for rendering pixels of the display. A pixel may refer to the smallest element or sample of an image, such as in a digital image, and a display panel may render a pixel of an image using multiple sub-pixels of different respective constituent colors, e.g., red, green, blue, and/or other colors. The sub-pixels may be respectively illuminated in particular combinations of intensity to render a particular color in a pixel.

BRIEF DESCRIPTION OF THE DRAWINGS

FIGS. 3A-4B illustrate example sub-pixel emission patterns for rendering a color within Zone C of the color space diagram of FIG. 2 in a first pixel type and a second pixel type, respectively.

FIGS. 4A-4B illustrate example sub-pixel emission patterns for rendering a color within Zone Y of the color space diagram of FIG. 2 in a first pixel type and a second pixel type, respectively.

DETAILED DESCRIPTION

Figure 1A:
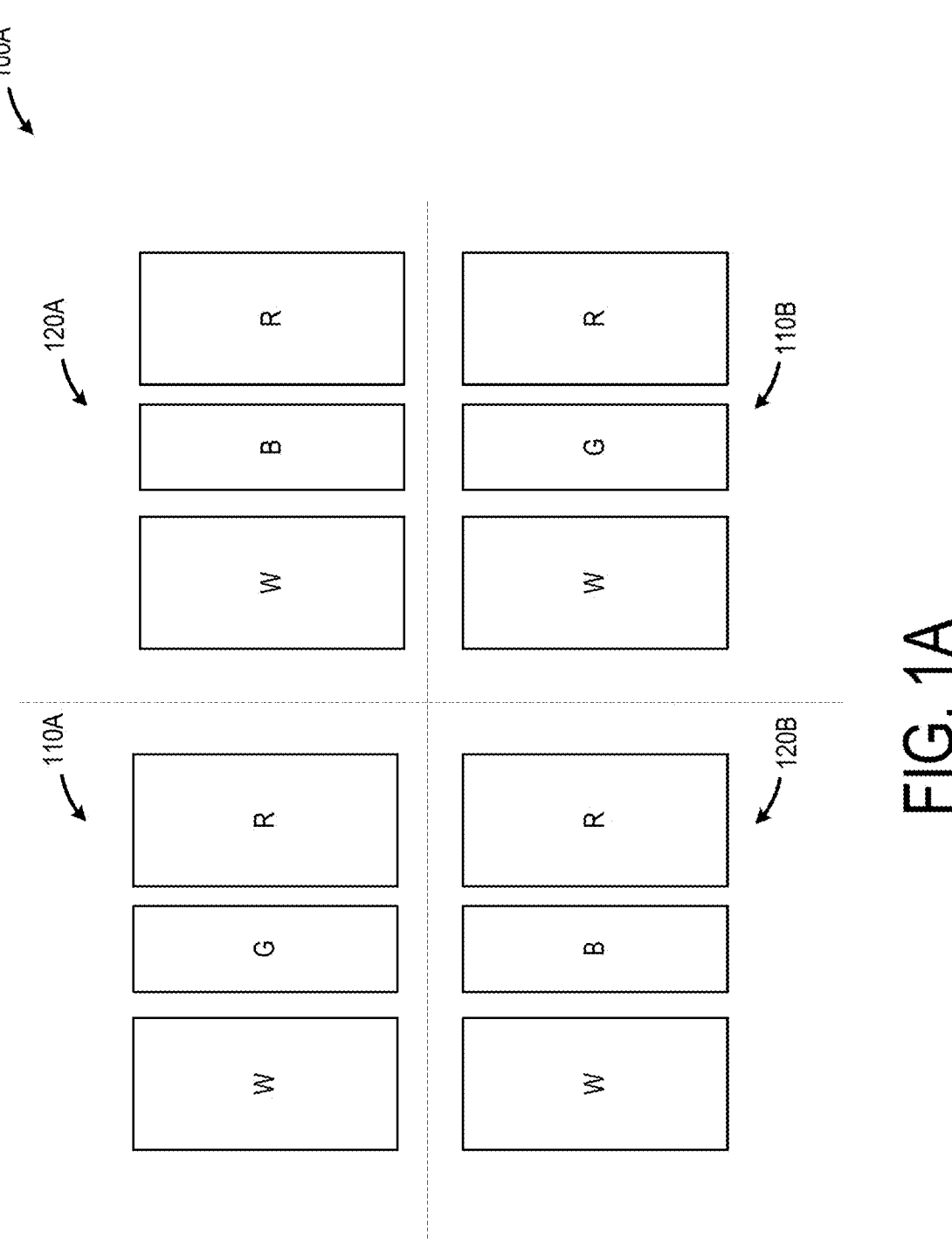
FIGS. 1A-1C illustrate example sub-pixel arrangements for rendering four pixels in a display panel in accordance with embodiments herein.

Embodiments described herein implement novel sub-pixel arrangements for rendering pixels in light emitting diode (LED)-based display panels. Various sub-pixel matrix arrangements have been implemented in current display technologies. Some examples include a PenTile™ RGBG layout, which uses green pixels interleaved with alternating red and blue pixels (in a linear or diagonal arrangement), PenTile™ RGBW layout, which uses alternating pixel types that include red and green sub-pixels in a first type and blue and white sub-pixels in a second type, and a PenTile™ RGWRGB layout, which uses alternating pixel types that include red, green, and white sub-pixels in one type and red, green, and blue sub-pixels in a second type.

These previous designs have presented certain issues, however. For instance, the PenTile™ RGBG layout is typically implemented in self-emission displays (e.g., organic LED (OLED)-based displays) and color rendering for a pixel is based on the three sub-pixel colors (i.e., a combination of red, green, and blue). For instance, white is rendered by a combination of all three sub-pixels. As such, the power used by each pixel is considered "brightness increasing", which can have particular negative impact on larger panels. The latter two examples above are typically implemented in self-emission devices as well, using white emitters with color filters to emit the different sub-pixel colors. While this may provide power savings over the RGBG layout, the pixel color rendering may be less ideal.

In contrast, embodiments herein include novel sub-pixel matrix arrangements that may be implemented in LED-based panels, e.g., Micro LED (uLED) panels, and provide one or more improvements or advantages to current arrangements. For instance, certain embodiments may provide lower power consumption and/or the potential for brighter images. Further, certain embodiments may render pixels with fewer sub-pixels than some current arrangements/layouts. Some embodiments may utilize amplitude modulation (e.g., pulse amplitude modulation (PAM)) to drive the LEDs of the panel (as opposed to pulse width modulation (PWM)), which can allow for mass production of such panels.

In the following description, specific details are set forth, but embodiments of the technologies described herein may be practiced without these specific details. Well-known circuits, structures, and techniques have not been shown in detail to avoid obscuring an understanding of this description. "An embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact.

The description may use the phrases "in an embodiment," "in embodiments," "in some embodiments," and/or "in various embodiments," each of which may refer to one or more of the same or different embodiments. Furthermore, the terms "comprising," "including," "having," and the like, as used with respect to embodiments of the present disclosure, are synonymous.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Figure 1B:
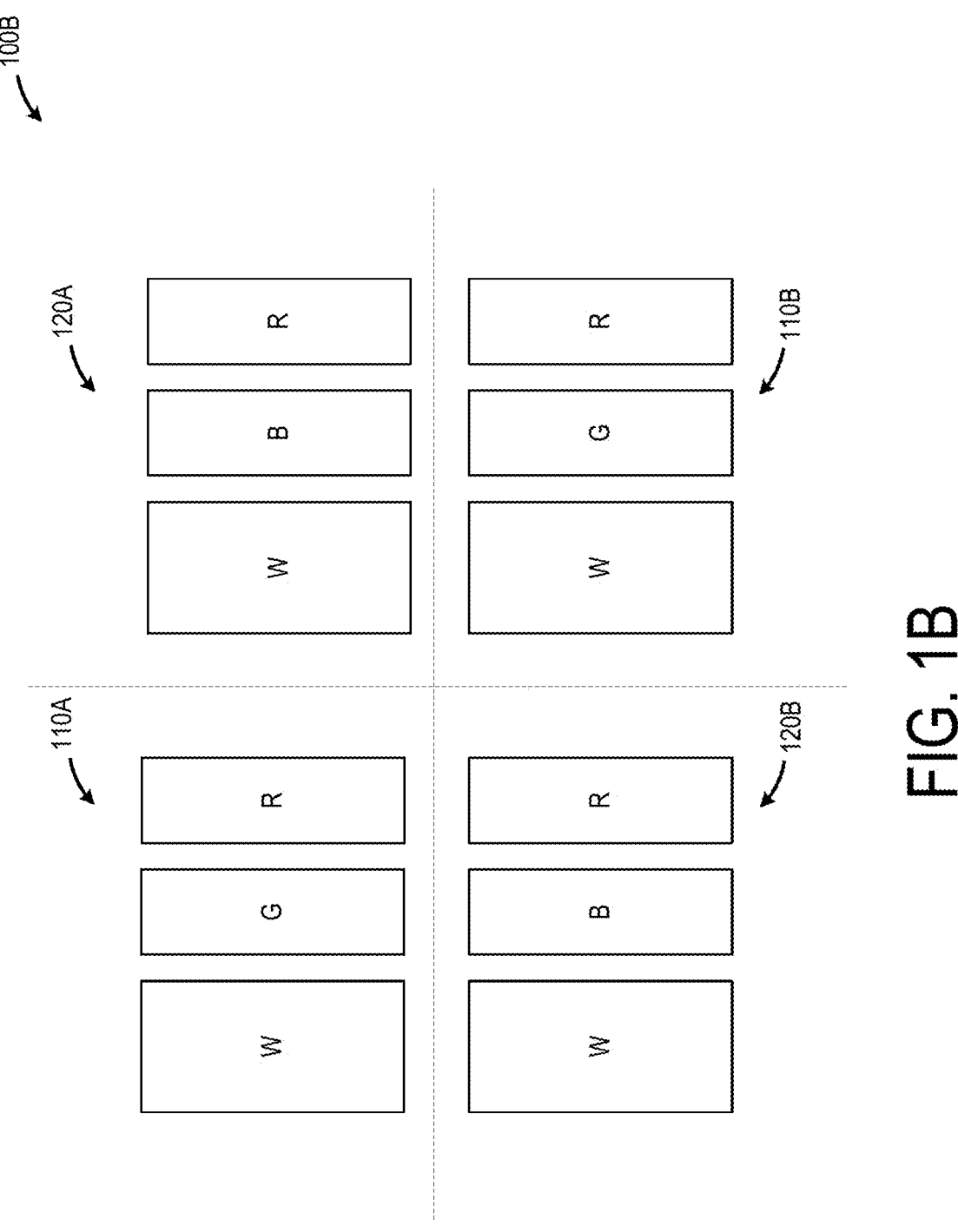
Figure 1C:
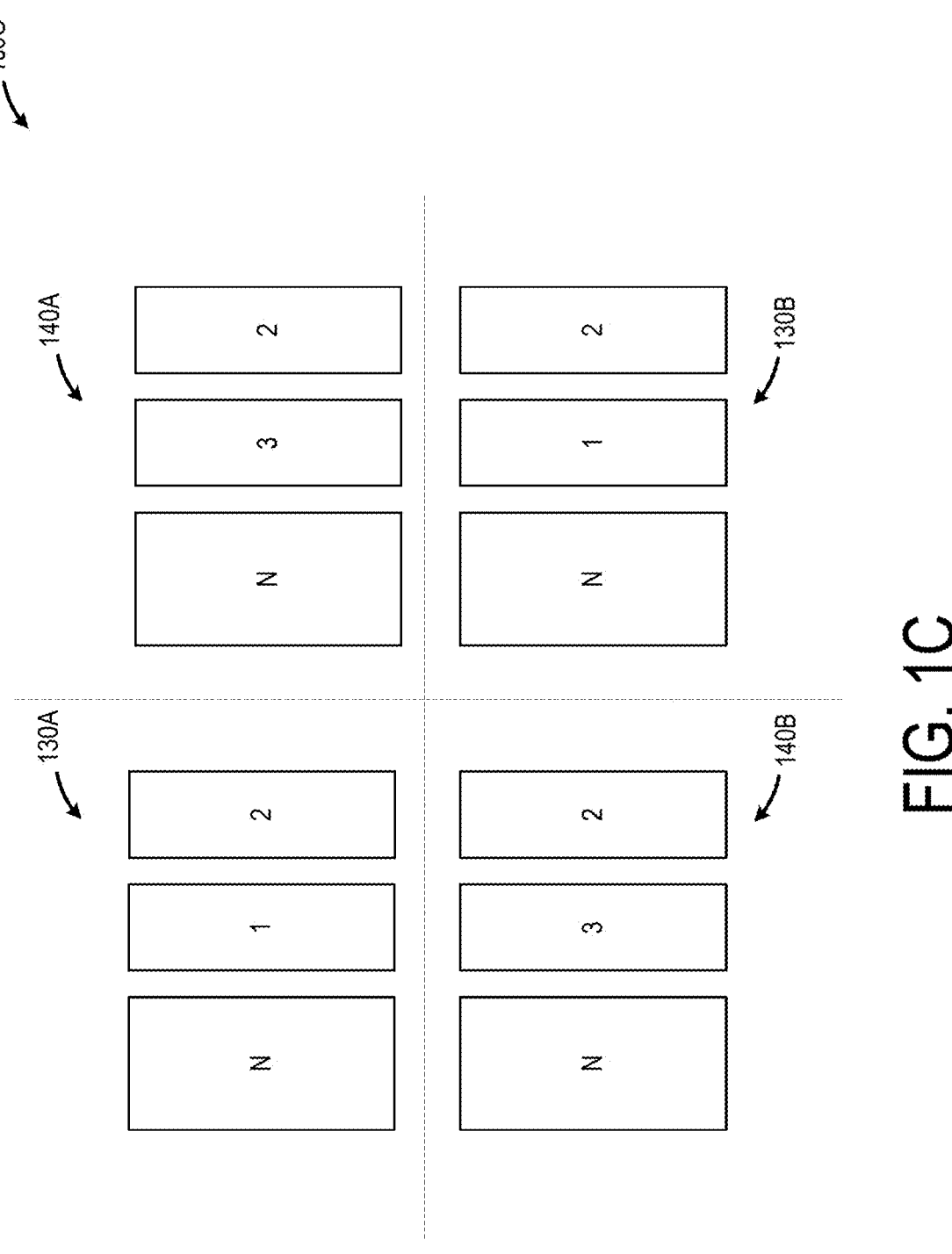

FIGS. 1A-1C illustrate example sub-pixel arrangements 100A, 100B for rendering four pixels in a display panel in accordance with embodiments herein. In particular embodiments, the 2×2 pixel arrangements shown may be repeated to create displays of larger than four pixels, e.g., displays with 1920×1080 pixels, 2560×1440 pixels, 3440×1440 pixels, 3840×2160 pixels, or other display sizes. The example arrangements include two different sub-pixel arrangements that form distinct pixel types 110, 120, and the pixel types may be alternated in each row and column of a panel to form a larger display. The first pixel type 110 includes three sub-pixels: a first sub-pixel that emits substantially white light (indicated by W), a second sub-pixel that emits substantially green light (indicated by G), and a third sub-pixel that emits substantially red light (indicated by R). The second pixel type 120 also includes three sub-pixels: a first sub-pixel that emits substantially white light (indicated by W), a second sub-pixel that emits substantially blue light (indicated by B), and a third sub-pixel that emits substantially red light (indicated by R). As used herein, substantially white light may refer to light that appears generally white to a viewer, e.g., with a correlated color temperature in the range of 3000-7000 K (e.g., CIE (x,y): (0.3127, 0.329)); substantially red light may refer to light with a wavelength between 620-750 nm (e.g., CIE (x,y)=(0.68, 0.332)); substantially blue light may refer to light with a wavelength between 425-495 nm (e.g., CIE (x,y)=(0.15, 0.06)); and substantially green light may refer to light with a wavelength between 495-570 nm (e.g., CIE (x,y)=(0.265, 0.69)). Each sub-pixel of the example arrangements may include an LED light emission source and may be implemented using a Micro LED structure such as those shown in FIGS. 6-7 and described further below. In the example shown, each sub-pixel is rectangularly shaped; however, other shapes of sub-pixels may be implemented in other embodiments, e.g., circular, elliptical, octagonal, etc.

In each example, the respective first, second, and third sub-pixels of each type are the same size as one another; i.e., the first sub-pixel of the first pixel type 110 is the same size as the first sub-pixel of the second pixel type 120, the second sub-pixel of the first pixel type 110 is the same size as the second sub-pixel of the second pixel type 120, and the third sub-pixel of the first pixel type 110 is the same size as the third sub-pixel of the second pixel type 120. In the example shown in FIG. 1A, the first and third sub-pixels of each type 110, 120 are the same size while the second sub-pixel of each type 110, 120 is half the size of the first and third sub-pixels. In the example shown in FIG. 1A, the second and third sub-pixels of each type 110 are half the size of the first sub-pixel. Other embodiments may use sub-pixels of different relative sizes than those shown in FIGS. 1A-1B. Further, other embodiments may arrange the sub-pixels of each pixel type in a different order/location than as shown.

FIG. 1C illustrates a more general sub-pixel arrangement 100C for rendering four pixels in a display panel in accordance with embodiments herein. While the examples described herein utilize the color sub-pixel color selections shown in FIGS. 1A-1B, certain embodiments may utilize different sub-pixel color choices. In the example shown, there are two distinct pixel types 130, 140, and the pixel types may be alternated in each row and column of a panel to form a larger display, just as with the examples shown in FIGS. 1A-1B. The first pixel type 130 includes three sub-pixels: a first sub-pixel that emits neutral light (indicated by N), a second sub-pixel that emits a first color light (indicated by 1), and a third sub-pixel that emits a second color light (indicated by 2). The second pixel type 140 also includes three sub-pixels: a first sub-pixel that emits neutral light (indicated by N), a second sub-pixel that emits a third color light (indicated by 3), and a third sub-pixel that emits the second color light (indicated by 2). As used herein, a neutral light may refer to a light with CIE coordinates (e.g., in the color space diagram shown in FIG. 2) that are within the coordinates of the first, second, and third colors in the CIE color space. The neutral light may be substantially white, e.g., as described above, or may tend toward a particular color. The neutral, first, second, and third colors may be chosen such that a three zone model for rendering colors, e.g., as described below, can be implemented.

Figure 2:
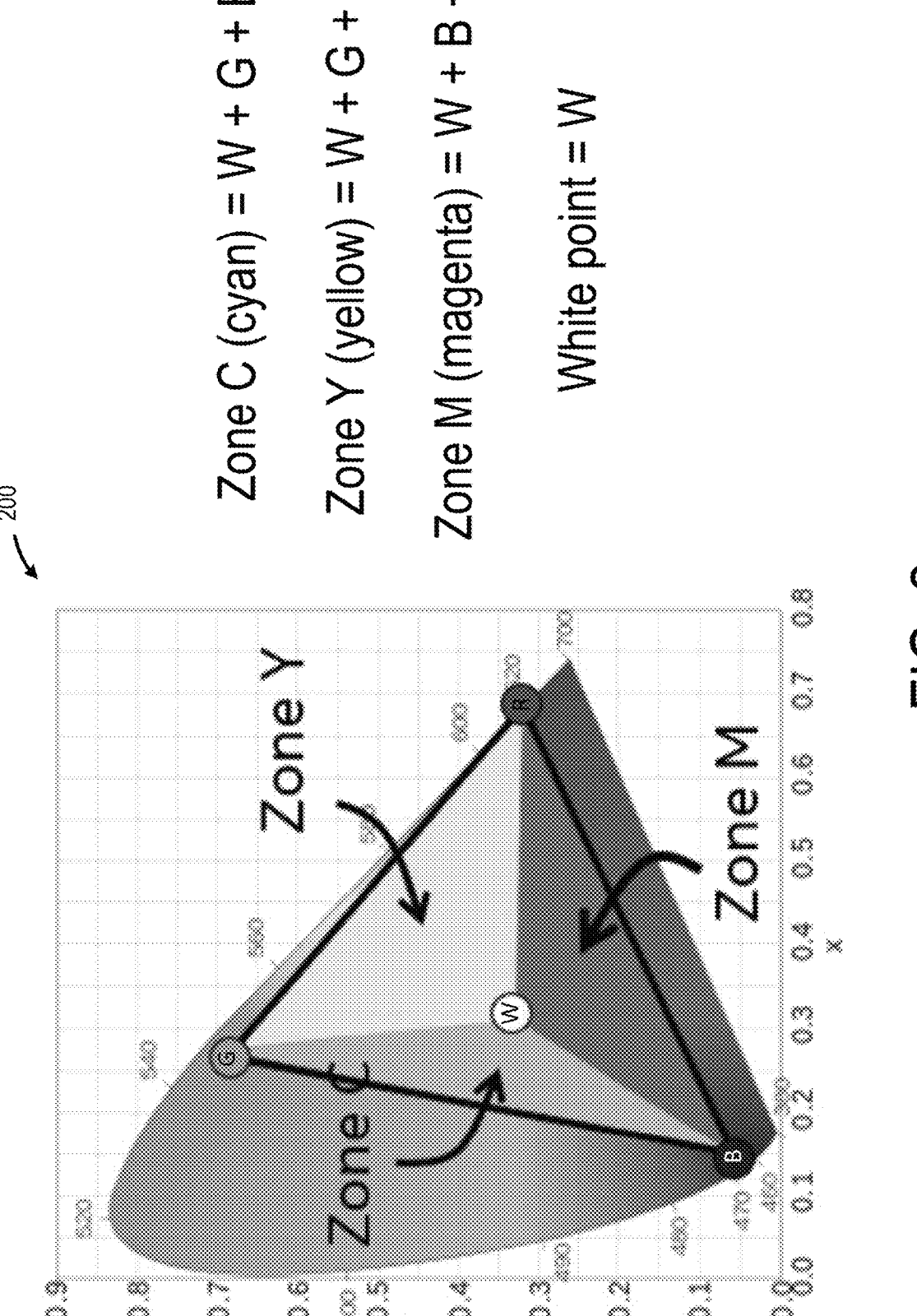
FIG. 2 illustrates an x-y CIE color space diagram indicating example sub-pixel colors for the arrangements in FIGS. 1A-1B within the color space.

FIG. 2 illustrates an x-y CIE color space diagram 200 indicating example sub-pixel colors for the arrangements in FIGS. 1A-1B within the color space. In addition, FIG. 2 illustrates a three-zone model for rendering colors using the sub-pixel arrangements of FIGS. 1A-1B (and of FIGS. 8A-8B as well). That is, to render a color in the indicated Zone C (cyan), white, green, and blue sub-pixels may be illuminated (with various intensities to achieve a particular color within the zone); to render a color in the indicated Zone Y (yellow), white, green, and red sub-pixels may be illuminated; to render a color in the indicated Zone M (magenta), white, blue, and red sub-pixels may be illuminated; and to render a white point, just the white sub-pixel may be illuminated (or in some case, for additional brightness, additional white sub-pixels and/or red, green, and blue sub-pixels from the pixel and surrounding pixels may be illuminated as well). As will be seen, however, each pixel will contain sub-pixels with all of these colors. Thus, in embodiments herein, pixels that do not include a sub-pixel of a needed color to render a particular color for the pixel may "borrow" sub-pixels from neighboring pixels to render the particular color. Examples are described below with respect to FIGS. 3A-3B, 4A-4B, and 5A-5B, for each Zone indicated in the color chart 200.

Figure 3A:
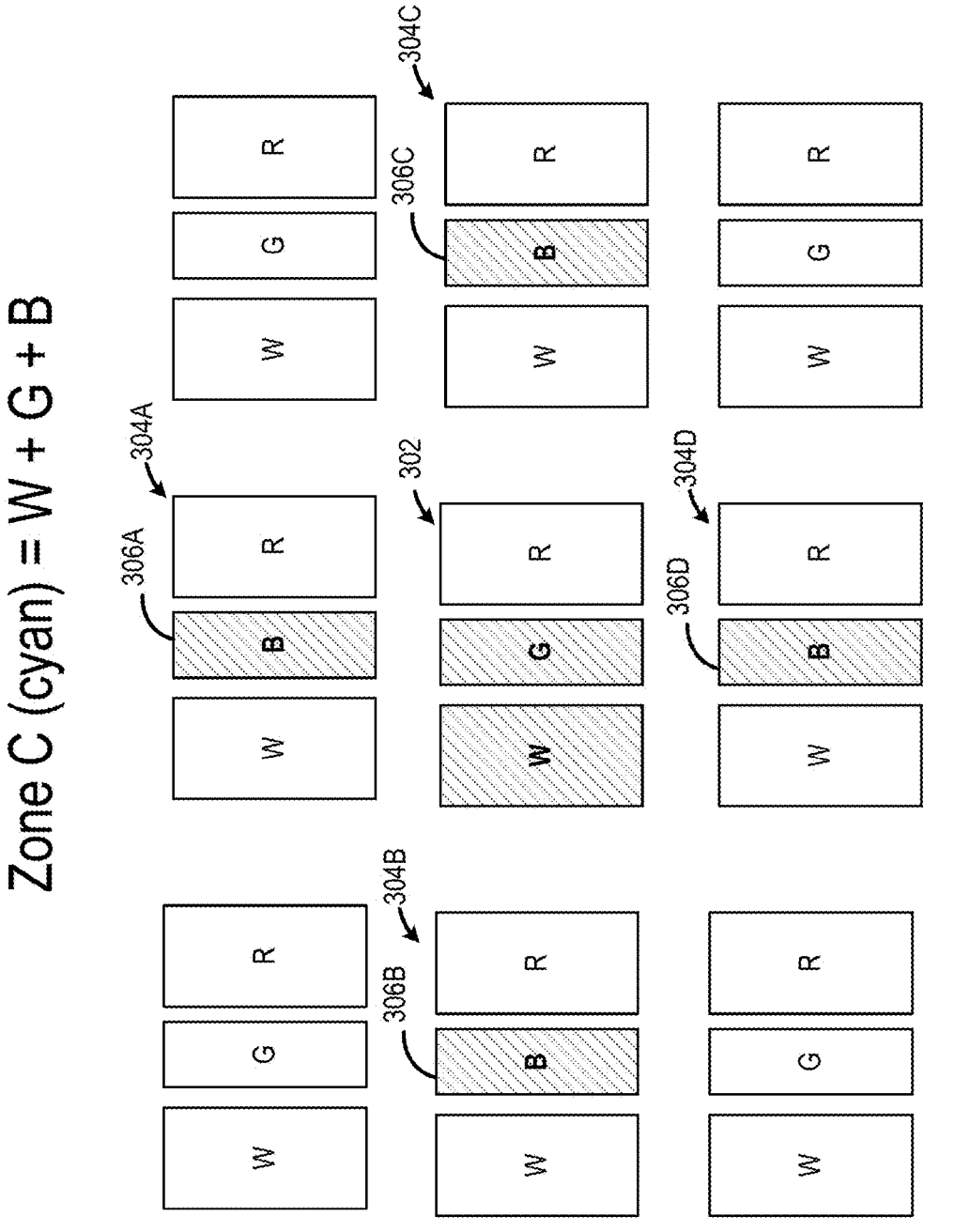

FIGS. 3A-4B illustrate example sub-pixel emission patterns for rendering a color within Zone C of the color space diagram 200 of FIG. 2 in a first pixel type and a second pixel type, respectively. As shown in FIG. 2, to render a color in Zone C of the color space diagram 200, white, green, and blue sub-pixels may be illuminated. Referring to FIG. 3A, the example pixel 302 (which is the same as the first pixel type 110 of FIGS. 1A-1B) includes the white and green sub-pixels; however, it does not include a blue sub-pixel. Thus, to render colors in Zone C, the blue sub-pixels of one or more of the neighboring pixels 304 may be illuminated with the white and green sub-pixels of the pixel 302. For example, in some embodiments, all of the blue sub-pixels 306 may be illuminated, while in other embodiments, only a subset of the blue sub-pixels 306 may be illuminated (e.g., only one of 306A-D, 306A and 306D, 306B and 306C, or any other combination of the blue sub-pixels 306).

Figure 3B:
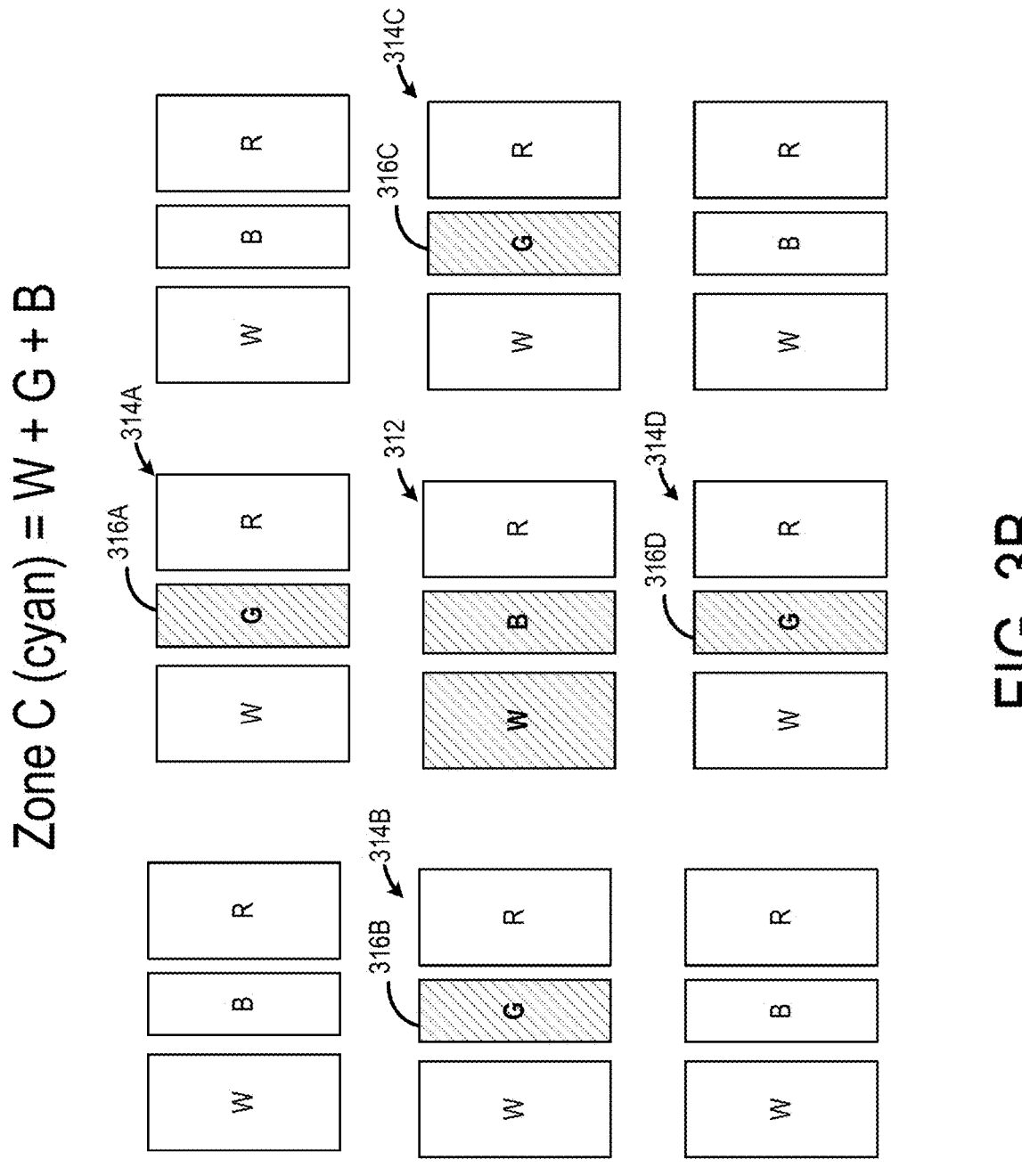

Referring now to FIG. 3B, the example pixel 312 (which is the same as the second pixel type 120 of FIGS. 1A-1B) includes the white and blue sub-pixels but does not include a green sub-pixel. Thus, to render colors in Zone C, the green sub-pixels of one or more of the neighboring pixels 314 may be illuminated with the white and blue sub-pixels of the pixel 312. For example, in some embodiments, all of the green sub-pixels 316 may be illuminated, while in other embodiments, only a subset of the green sub-pixels 316 may be illuminated (e.g., only one of 316A-D, 316A and 316D, 316B and 316C, or any other combination of the green sub-pixels 316).

Figure 4A:
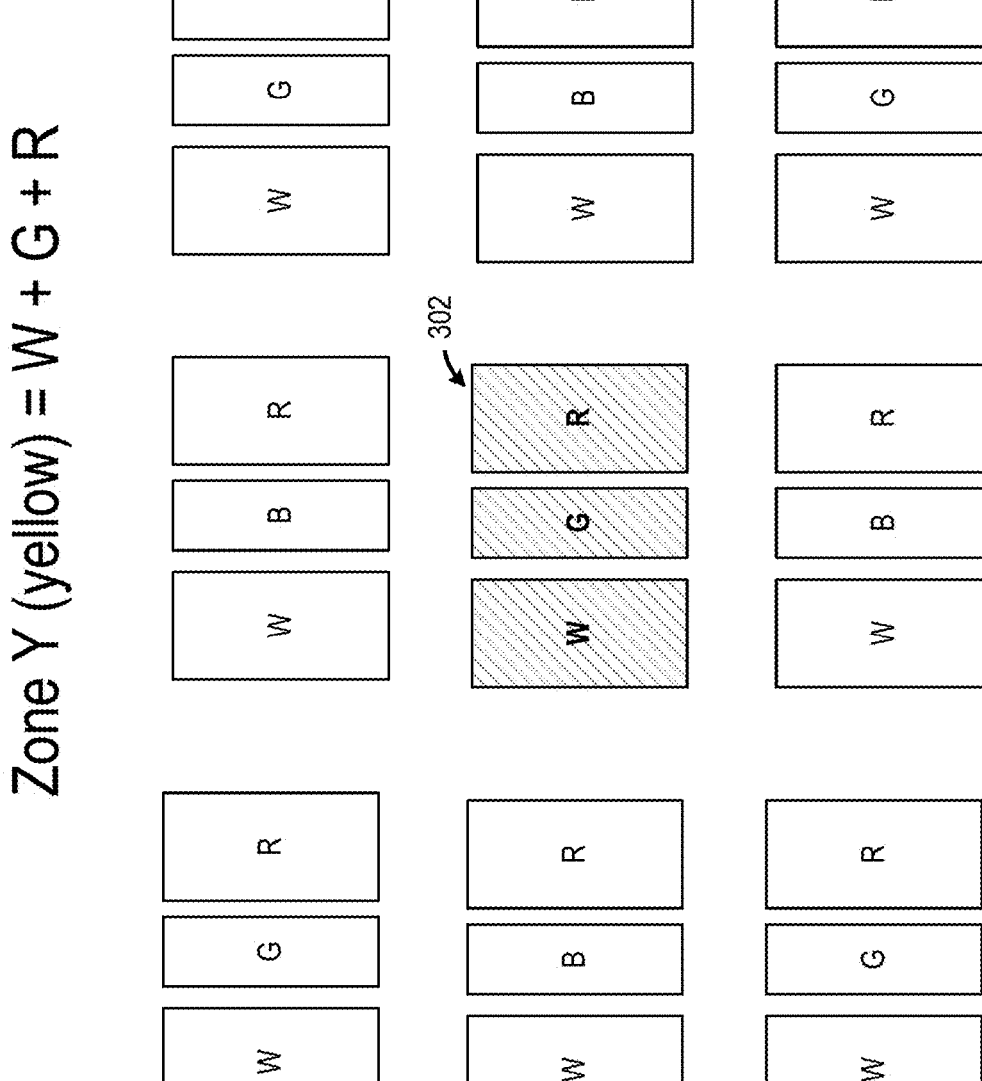
Figure 4B:
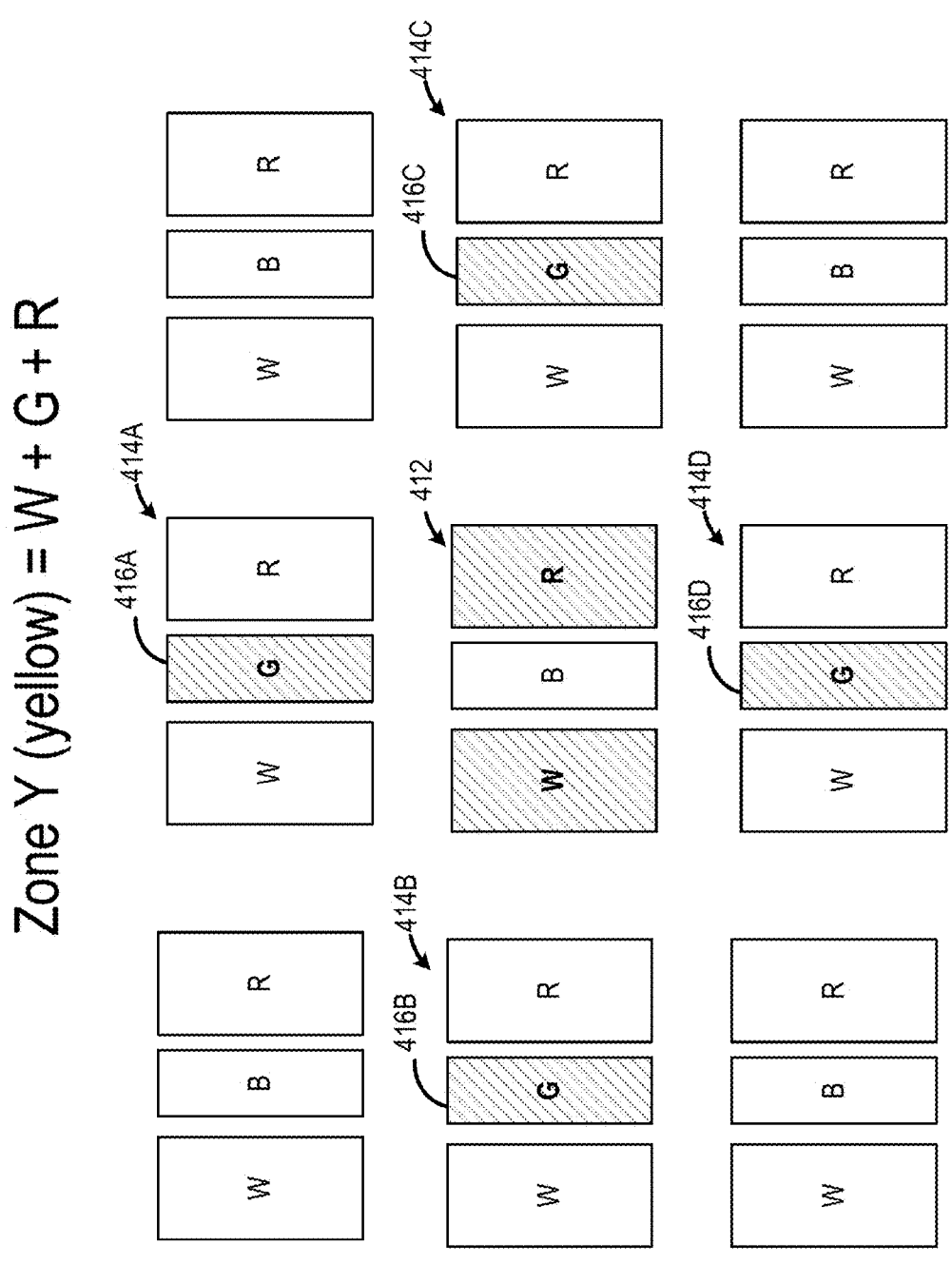

FIGS. 4A-4B illustrate example sub-pixel emission patterns for rendering a color within Zone Y of the color space diagram 200 of FIG. 2 in a first pixel type and a second pixel type, respectively. As shown in FIG. 2, to render a color in Zone Y of the color space diagram 200, white, green, and red sub-pixels may be illuminated. Referring to FIG. 4A, the example pixel 402 (which is the same as the first pixel type 110 of FIGS. 1A-1B) includes the white, green, and red sub-pixels, so each of them may be illuminated to render a color in Zone Y. Referring now to FIG. 4B, the example pixel 412 (which is the same as the second pixel type 120 of FIGS. 1A-1B) includes the white and red sub-pixels but does not include a green sub-pixel. Thus, to render colors in Zone Y, the green sub-pixels of one or more of the neighboring pixels 414 may be illuminated with the white and red sub-pixels of the pixel 412. For example, in some embodiments, all of the green sub-pixels 416 may be illuminated, while in other embodiments, only a subset of the green sub-pixels 416 may be illuminated (e.g., only one of 416A-D, 416A and 416D, 416B and 416C, or any other combination of the green sub-pixels 416).

Figure 5A:
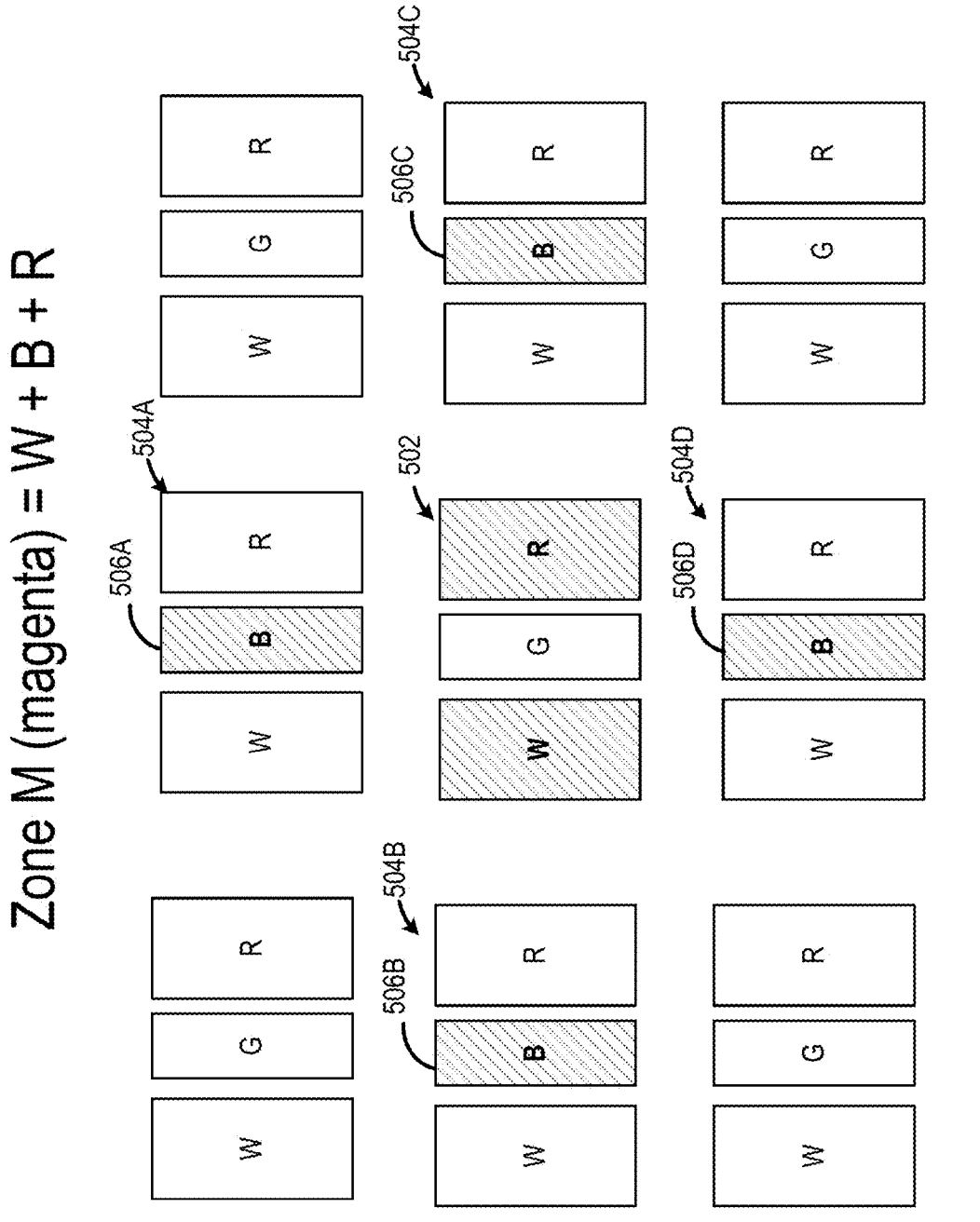
FIGS. 5A-5B illustrate example sub-pixel emission patterns for rendering a color within Zone M of the color space diagram of FIG. 2 in a first pixel type and a second pixel type, respectively.
Figure 5B:
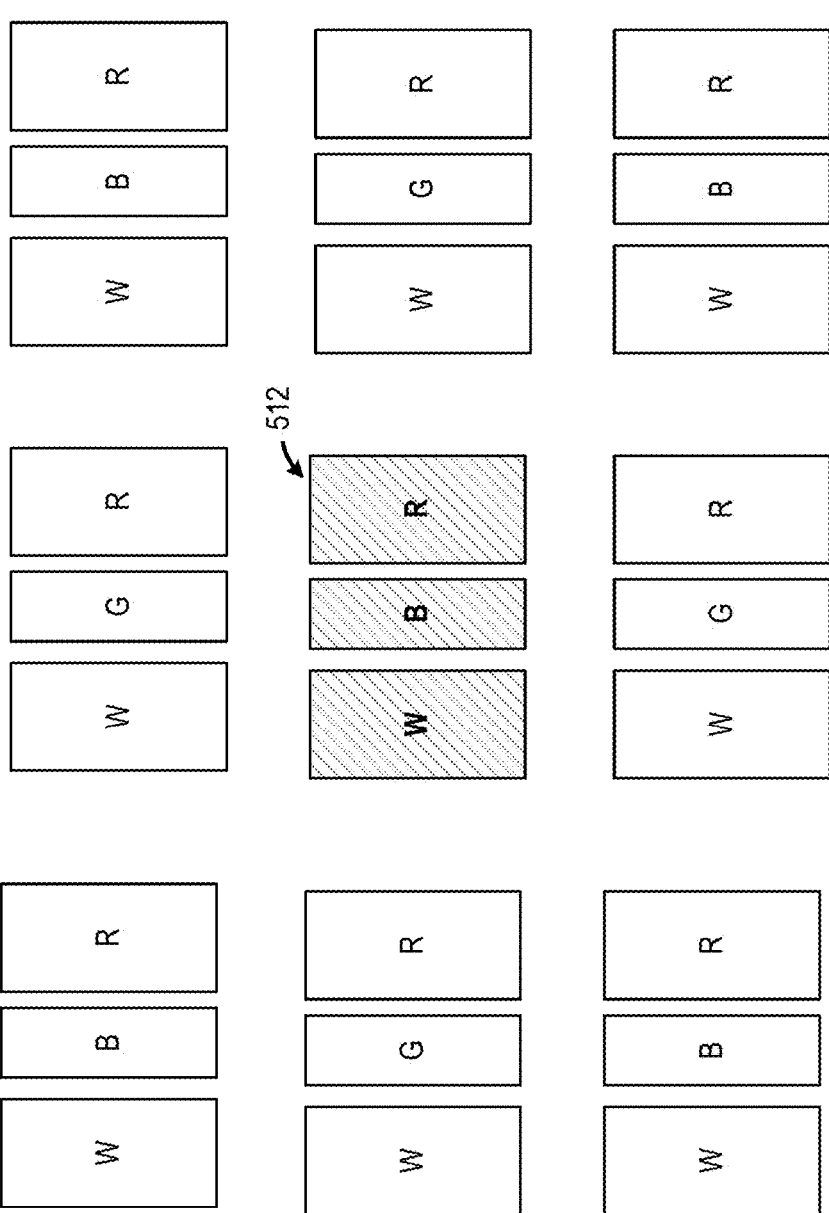

FIGS. 5A-5B illustrate example sub-pixel emission patterns for rendering a color within Zone M of the color space diagram 200 of FIG. 2 in a first pixel type and a second pixel type, respectively. As shown in FIG. 2, to render a color in Zone M of the color space diagram 200, white, blue, and red sub-pixels may be illuminated. Referring to FIG. 5A, the example pixel 502 (which is the same as the first pixel type 110 of FIGS. 1A-1B) includes the white and red sub-pixels; however, it does not include a blue sub-pixel. Thus, to render colors in Zone M, the blue sub-pixels of one or more of the neighboring pixels 504 may be illuminated with the white and red sub-pixels of the pixel 502. For example, in some embodiments, all of the blue sub-pixels 506 may be illuminated, while in other embodiments, only a subset of the blue sub-pixels 506 may be illuminated (e.g., only one of 506A-

D, 506A and 506D, 506B and 506C, or any other combination of the blue sub-pixels 506). Referring now to FIG. 5B, the example pixel 512 (which is the same as the second pixel type 120 of FIGS. 1A-1B) includes the white, blue, and red sub-pixels so each may be illuminated to render colors in Zone M without the need for illuminating sub-pixels of one or more of the neighboring pixels.

Figure 6:
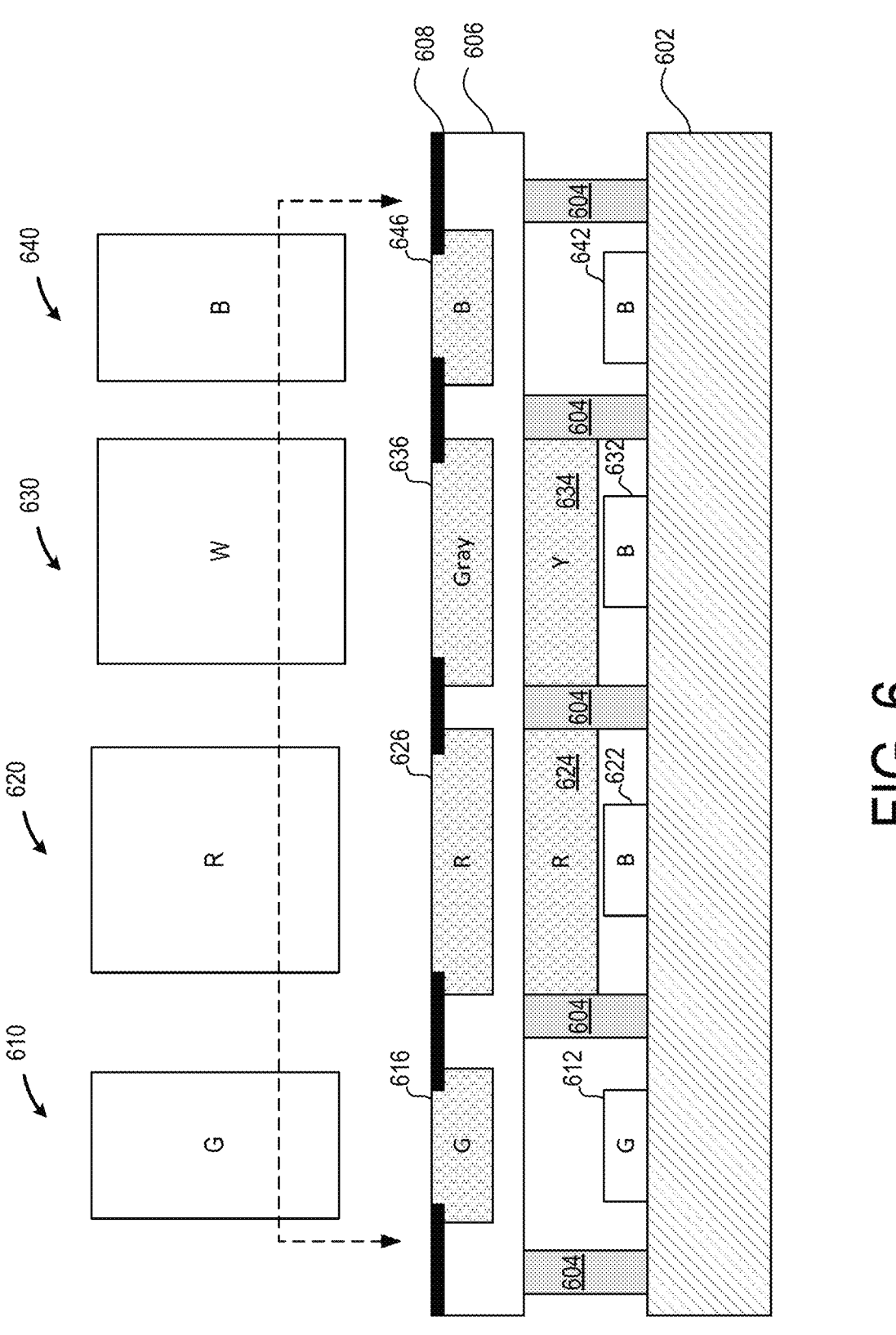
FIG. 6 illustrates an example cross section of sub-pixels in the arrangements shown in FIGS. 1A-1B.

FIG. 6 illustrates an example cross section of sub-pixels in the arrangements shown in FIGS. 1A-1B—specifically for the green (610), red (620), white (630), and blue (640) sub-pixels. In the example shown, each pixel includes an LED light source (612, 622, 632, 642) that is powered/ driven by a driving substrate 602. The LED light sources may be Micro LEDs in certain embodiments. The LED light sources may be contained within respective wells defined by walls 604, which effectively define the boundaries/size of each sub-pixel. In some instances, as described below, a color convert material (e.g., quantum dots or phosphors) may be injected or otherwise placed in certain of the wells such that it is proximate to the LED source (e.g., surrounds the LED source). The color convert material may be used to augment the wavelength of the light emitted by the LED. Each well is enclosed by a glass layer 606 with a black matrix 608 that further defines each sub-pixel of the panel. There is also, for each sub-pixel defined by the black matrix 608, a color filter that augments the wavelength of light emitted by the LED.

Referring specifically to the structure of the green sub-pixel 610, the LED source emits substantially green light (e.g., between 520-555 nm), no color convert material is included in the well, and a green color filter 616 is used. Referring to the structure of the red sub-pixel 620, the LED source emits substantially blue light (e.g., between 450-480 nm), a red color convert material is included in the well, and a red color filter 626 is used (e.g., to filter light between 640-700 nm). Referring to the structure of the white sub-pixel 630, the LED source emits substantially blue light (e.g., between 450-480 nm), a yellow color convert material is included in the well, and a neutral color filter 636 is used (to emit substantially white light). Referring to the structure of the blue sub-pixel 610, the LED source emits substantially blue light, no color convert material is included in the well, and a blue color filter 646 is used.

Figure 7:
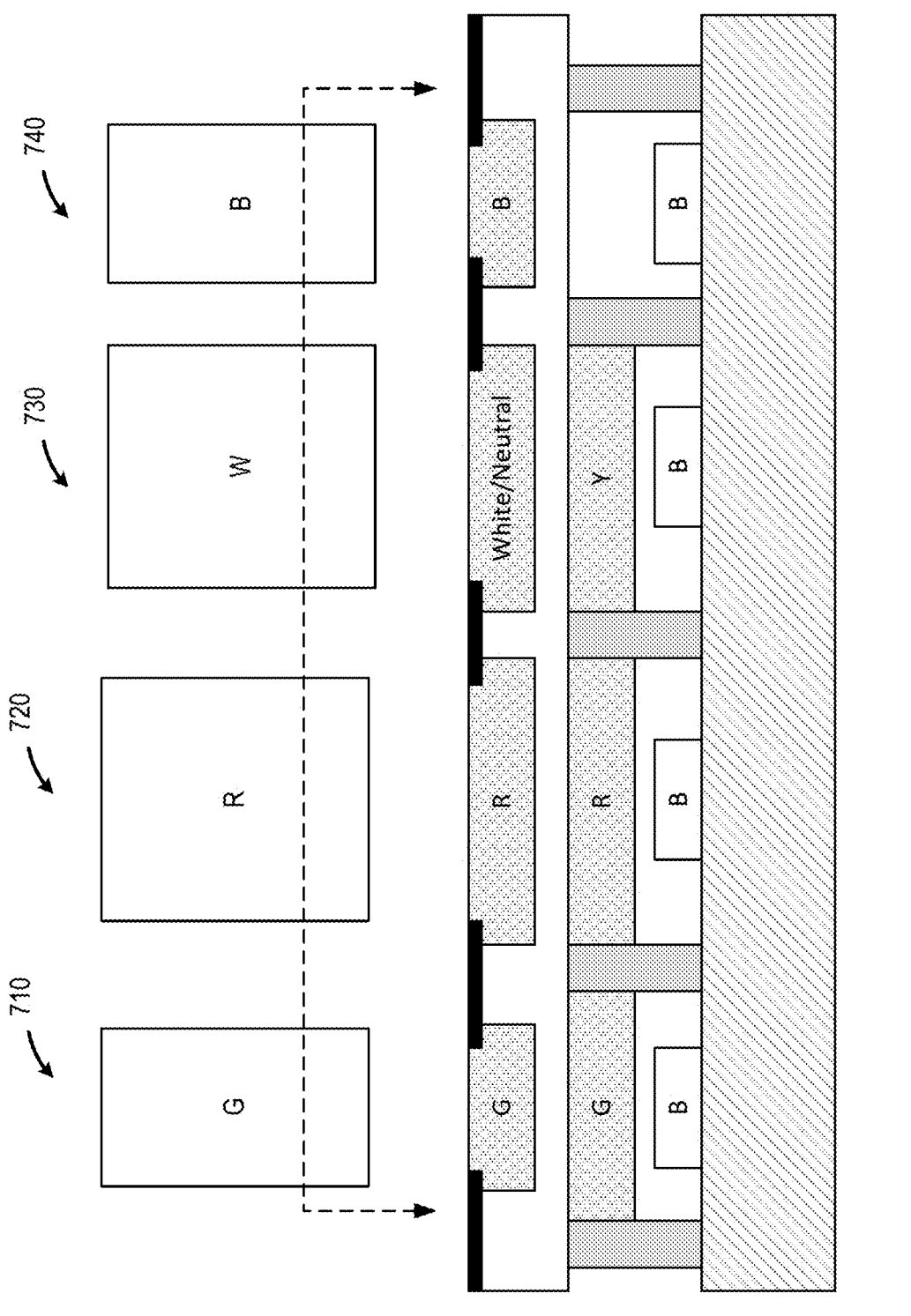
FIG. 7 illustrates another example cross section of sub-pixels in the arrangements shown in FIGS. 1A-1B.

FIG. 7 illustrates another example cross section of sub-pixels in the arrangements shown in FIGS. 1A-1B. The example shown in FIG. 7 is the same as that shown in FIG. 6, except that the green sub-pixel 710 utilizes an LED source that emits substantially blue light as well as a green color convert material proximate to the blue LED. A green color filter is used just as in the example of FIG. 6. The red (720), white (730), and blue (740) sub-pixels are configured in the same manner as shown in FIG. 6 and described above.

Figure 8A:
FIGS. 8A-8B illustrate additional example sub-pixel arrangements for rendering a single pixel in a display panel in accordance with embodiments herein.
Figure 8B:

FIGS. 8A-8B illustrate additional example sub-pixel arrangements for rendering a single pixel in a display panel in accordance with embodiments herein. The example sub-pixel arrangement shown in FIGS. 8A-8B may be used to render colors for the pixel in accordance with the three-zone color space diagram shown in FIG. 2. In particular embodiments, the 2×2 pixel arrangement shown may be repeated to create displays of larger than four pixels, e.g., displays with 1920×1080 pixels, 2560×1440 pixels, 3440×1440 pixels, 3840×2160 pixels, or other display sizes.

Referring to FIG. 8A, the example 2×2 pixel layout shown includes two different sub-pixel arrangements that form distinct pixel types 810, 820. The first pixel type 810 includes two sub-pixels: a first sub-pixel that emits substantially white light (indicated by W) and a second sub-pixel that emits substantially red light (indicated by R); and the second pixel type 820 includes two sub-pixels: a first sub-pixel that emits substantially white light (indicated by W) and a second sub-pixel that emits substantially blue light (indicated by B). Each pixel type 810, 820 includes portions of a green sub-pixel that spans multiple pixels. For instance, the green sub-pixel at the center of the 2×2 layout 800 is shared between each of the pixels 810A, 820A, 820B, 810B, with each respective pixel of the layout 800 having a quarter of the shared green sub-pixel therein. Referring to FIG. 8B, a more general sub-pixel arrangement 830 is shown with two pixel types 840, 850. The first pixel type 840 includes two sub-pixels: a first sub-pixel that emits neutral light (indicated by N) and a second sub-pixel that emits a first color light (indicated by 1); and the second pixel type 850 includes two sub-pixels: a first sub-pixel that emits neutral light (indicated by N) and a second sub-pixel that emits a second color light (indicated by 2). Each pixel type 840, 850 includes portions of a third color sub-pixel (indicated by 3) that spans multiple pixels. Each sub-pixel of the example arrangements may include an LED light emission source and may be implemented using a Micro LED structure similar to those shown in FIGS. 6-7.

In the examples shown, each sub-pixel is octagonally shaped; however, other shapes of sub-pixels may be implemented in other embodiments, e.g., rectangular, circular, elliptical, etc. In each example pixel of the layouts shown, the sub-pixels located inside each pixel are of a size that is different from the shared green sub-pixels; however, other embodiments may utilize sub-pixels that are all of the same size. Further, in the example shown, each non-shared sub-pixel in the layouts shown is oriented in a particular way to surround the center, shared green sub-pixel of the 2×2 layouts; however, the non-shared sub-pixels in each pixel may be arranged or oriented in another manner in other embodiments.

Figure 9A:
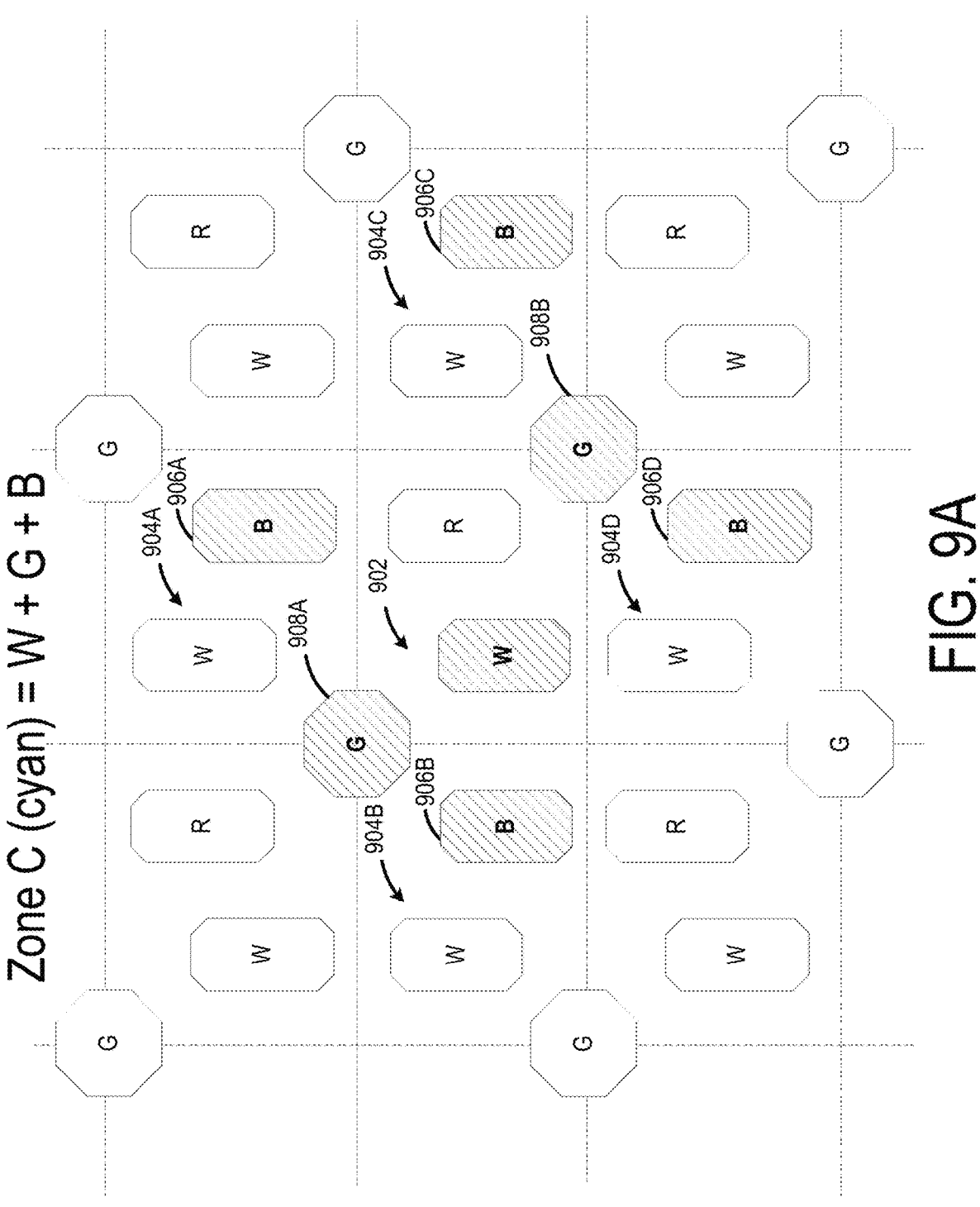
FIGS. 9A-9B illustrate example sub-pixel emission patterns for rendering a color within Zone C of the color space diagram of FIG. 2 in a first pixel type and a second pixel type, respectively, of the arrangement of FIG. 8A.
Figure 9B:
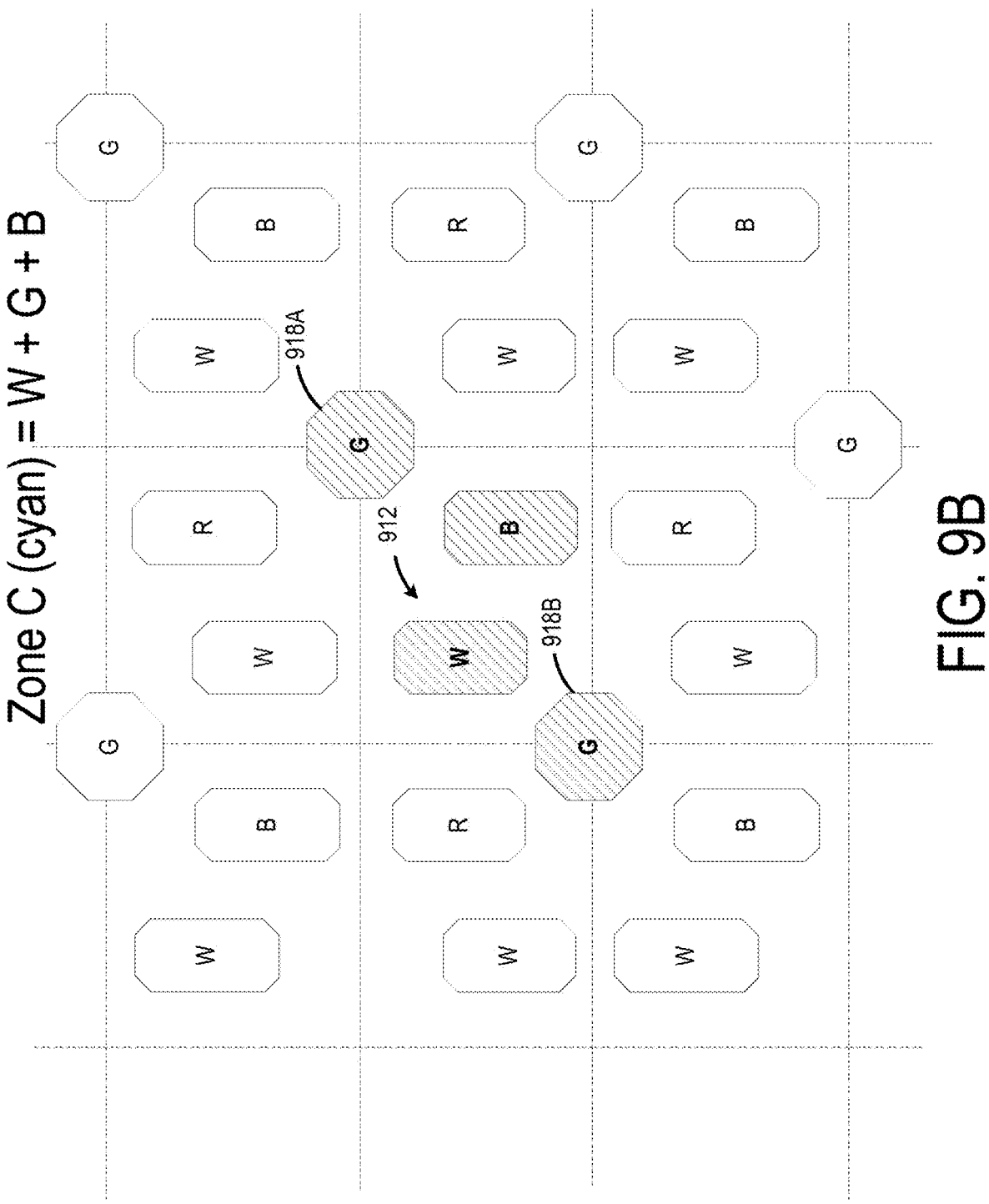

FIGS. 9A-9B illustrate example sub-pixel emission patterns for rendering a color within Zone C of the color space diagram 200 of FIG. 2 in a first pixel type and a second pixel type, respectively. As shown in FIG. 2, to render a color in Zone C of the color space diagram 200, white, green, and blue sub-pixels may be illuminated. Referring to FIG. 9A, the example pixel 902 (which is the same as the first pixel type 810 of FIG. 8) includes white and red sub-pixels and shares a green sub-pixel with surrounding pixels; however, it does not include a blue sub-pixel. Thus, to render colors in Zone C, the blue sub-pixels of one or more of the neighboring pixels 904 may be illuminated along with the white sub-pixel of the pixel 902 and the green sub-pixels that span into the pixel 902. For example, in some embodiments, all of the blue sub-pixels 906 may be illuminated, while in other embodiments, only a subset of the blue sub-pixels 906 may be illuminated (e.g., only one of 906A-D, 906A and 906D, 906B and 906C, or any other combination of the blue sub-pixels 906). Further, one or both of the shared green sub-pixels 908 may be illuminated. For example, only 908A, only 908B, or both may be illuminated. In some embodiments, the blue sub-pixels from neighboring pixels chosen to be illuminated may be based on the green shared sub-pixel that is illuminated. For example, where only 908A is illuminated, only 906B may be illuminated.

Referring now to FIG. 9B, the example pixel 912 (which is the same as the second pixel type 820 of FIG. 8) includes the white and blue sub-pixels and shares green sub-pixels with surrounding pixels. Thus, to render colors in Zone C, the white and blue sub-pixels of the pixel 912 and the shared green sub-pixels may be illuminated. In some embodiments, one or both of the shared green sub-pixels 918 may be illuminated. For example, only 918A, only 918B, or both may be illuminated.

Figure 10A:
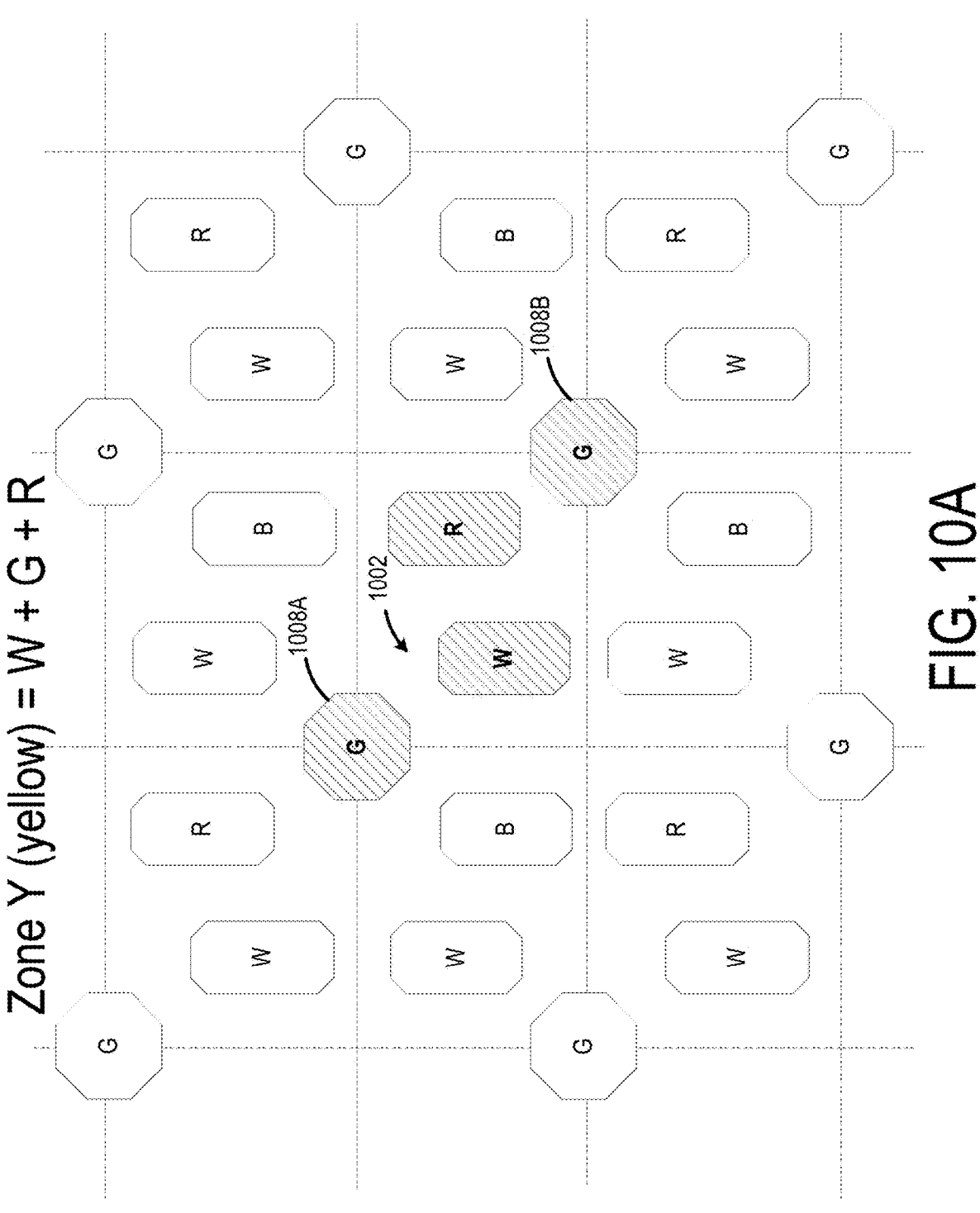
FIGS. 10A-10B illustrate example sub-pixel emission patterns for rendering a color within Zone Y of the color space diagram of FIG. 2 in a first pixel type and a second pixel type, respectively, of the arrangement of FIG. 8A.
Figure 10B:
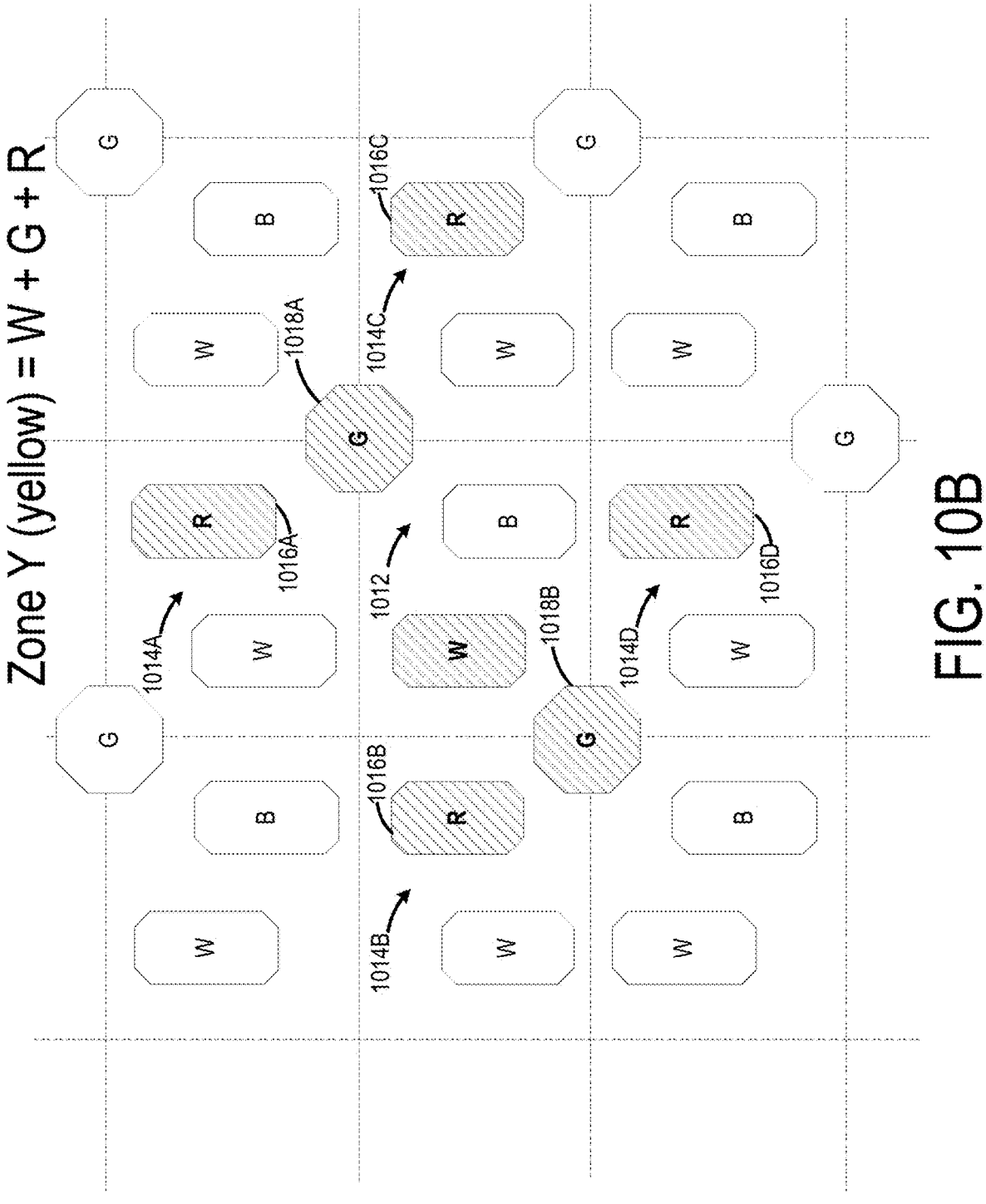

FIGS. 10A-10B illustrate example sub-pixel emission patterns for rendering a color within Zone Y of the color space diagram 200 of FIG. 2 in a first pixel type and a second pixel type, respectively. As shown in FIG. 2, to render a color in Zone Y of the color space diagram 200, white, green, and red sub-pixels may be illuminated. Referring to FIG. 10A, the example pixel 1002 (which is the same as the first pixel type 810 of FIG. 8) includes white and red sub-pixels and shares a green sub-pixel with surrounding pixels. Thus, to render colors in Zone Y, the white and red sub-pixels of the pixel 1012 and the shared green sub-pixels may be illuminated. In some embodiments, one or both of the shared green sub-pixels 1008 may be illuminated. For example, only 1008A, only 1008B, or both may be illuminated.

Referring now to FIG. 10B, the example pixel 1012 (which is the same as the second pixel type 820 of FIG. 8) includes the white and blue sub-pixels and shares green sub-pixels with surrounding pixels. Thus, to render colors in Zone Y, the red sub-pixels of one or more of the neighboring pixels 1014 may be illuminated along with the white sub-pixel of the pixel 1012 and the green sub-pixels that span into the pixel 1012. For example, in some embodiments, all of the red sub-pixels 1016 may be illuminated, while in other embodiments, only a subset of the red sub-pixels 1016 may be illuminated (e.g., only one of 1016A-D, 1016A and 1016D, 1016B and 1016C, or any other combination of the red sub-pixels 1016). Further, one or both of the shared green sub-pixels 1018 may be illuminated. For example, only 1018A, only 1018B, or both may be illuminated. In some embodiments, the red sub-pixels from neighboring pixels chosen to be illuminated may be based on the green shared sub-pixel that is illuminated. For example, where only 1018B is illuminated, only 1016B may be illuminated.

Figure 11A:
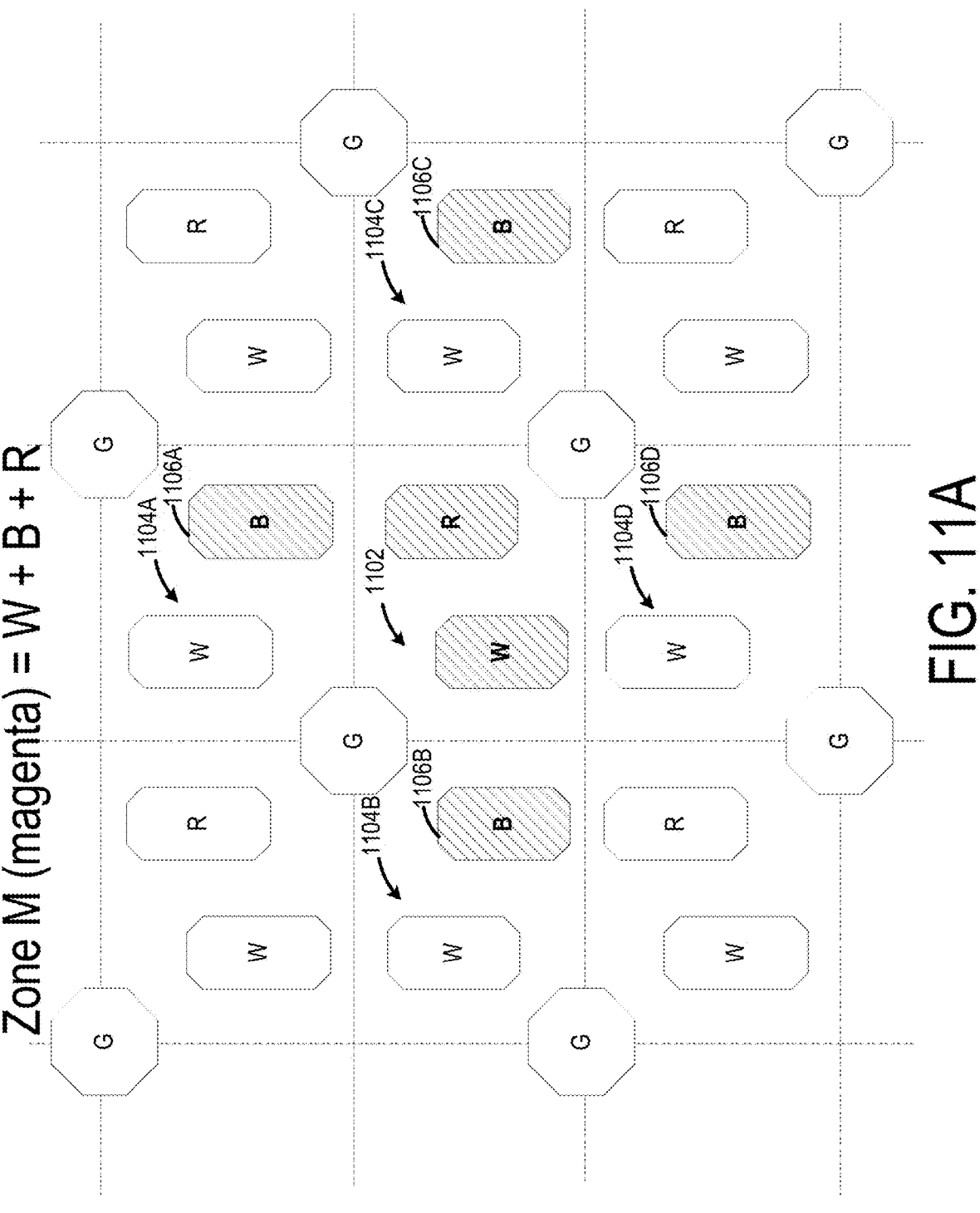
FIGS. 11A-11B illustrate example sub-pixel emission patterns for rendering a color within Zone M of the color space diagram of FIG. 2 in a first pixel type and a second pixel type, respectively, of the arrangement of FIG. 8A.
Figure 11B:
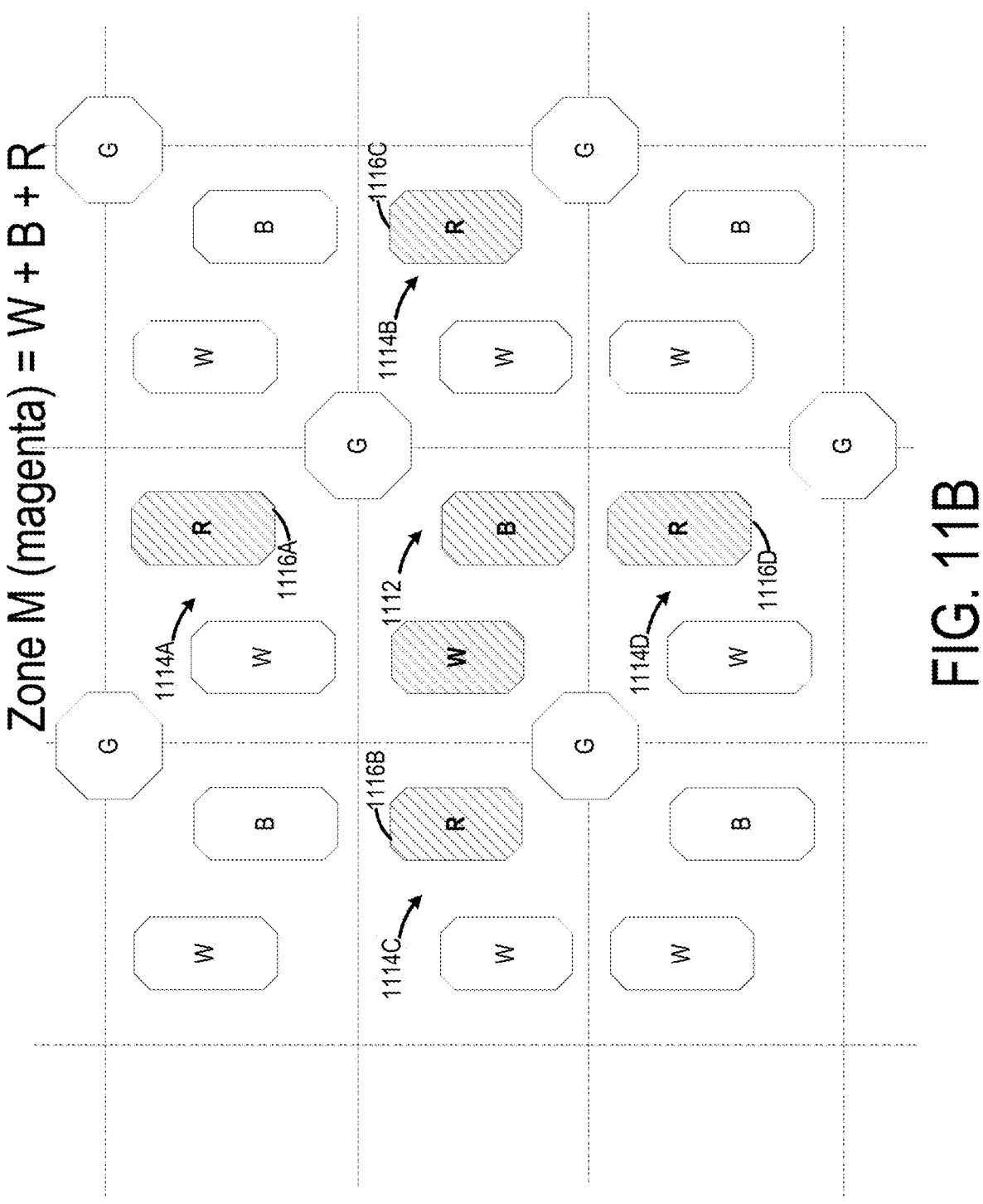

FIGS. 11A-11B illustrate example sub-pixel emission patterns for rendering a color within Zone M of the color space diagram 200 of FIG. 2 in a first pixel type and a second pixel type, respectively. As shown in FIG. 2, to render a color in Zone M of the color space diagram 200, white, blue, and red sub-pixels may be illuminated. Referring to FIG. 11A, the example pixel 1102 (which is the same as the first pixel type 810 of FIG. 8) includes white and red sub-pixels and shares a green sub-pixel with surrounding pixels; however, it does not include a blue sub-pixel. Thus, to render colors in Zone M, the blue sub-pixels of one or more of the neighboring pixels 1104 may be illuminated along with the white and red sub-pixels of the pixel 1102. For example, in some embodiments, all of the blue sub-pixels 1106 may be illuminated, while in other embodiments, only a subset of the blue sub-pixels 1106 may be illuminated (e.g., only one of 1106A-D, 1106A and 1106B, 1106C and 1106D, or any other combination of the blue sub-pixels 1106).

Referring now to FIG. 11B, the example pixel 1112 (which is the same as the second pixel type 820 of FIG. 8) includes the white and blue sub-pixels and shares green sub-pixels with surrounding pixels. Thus, to render colors in Zone M, the red sub-pixels of one or more of the neighboring pixels 1114 may be illuminated along with the white and blue sub-pixels of the pixel 1112. For example, in some embodiments, all of the red sub-pixels 1116 may be illuminated, while in other embodiments, only a subset of the red sub-pixels 1116 may be illuminated (e.g., only one of 1116A-D, 1116A and 1116C, 1116B and 1116D, or any other combination of the red sub-pixels 1116).

Figure 12A:
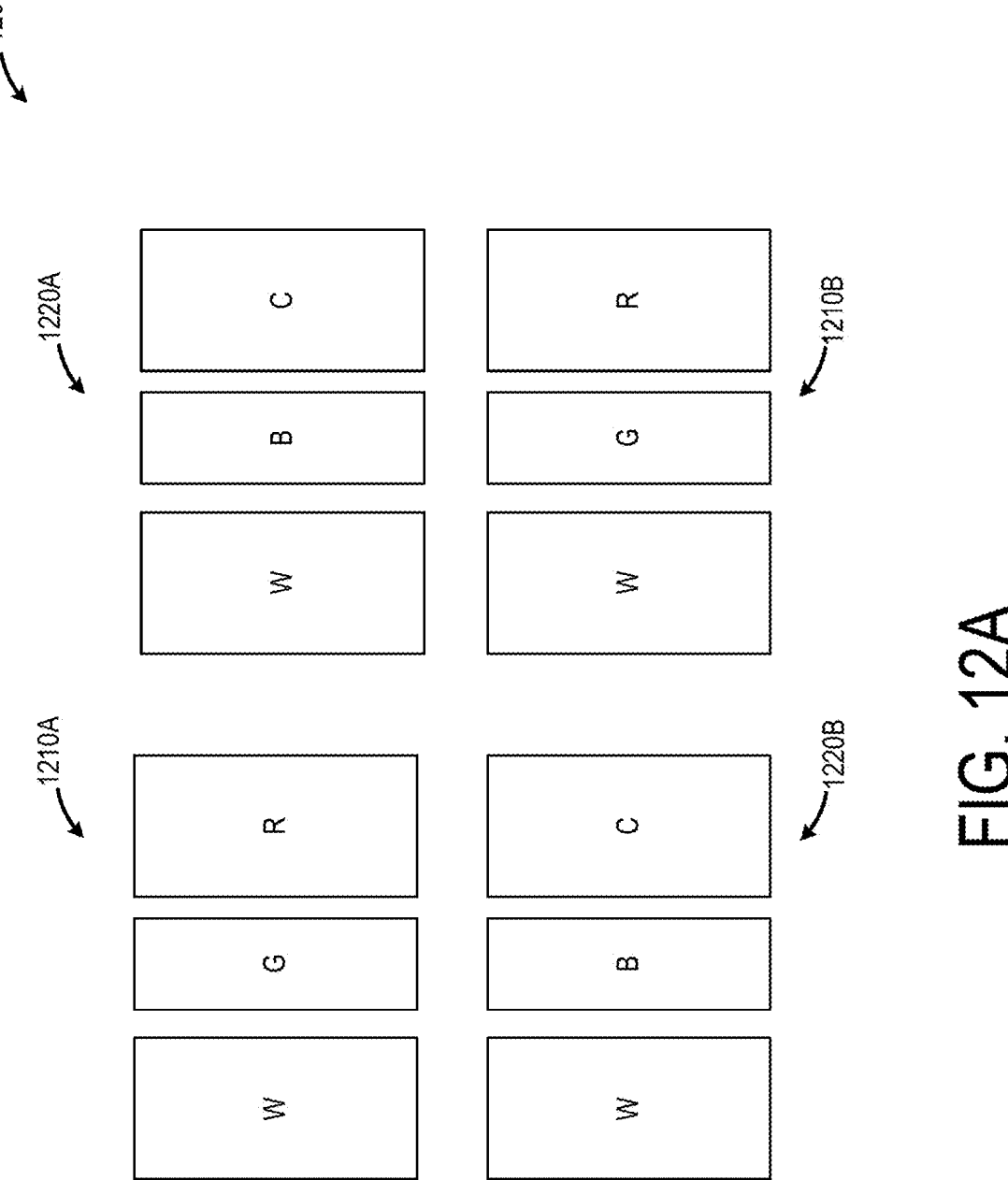
FIGS. 12A-12B illustrate other example sub-pixel arrangements for rendering four pixels in a display panel in accordance with embodiments herein.
Figure 12B:
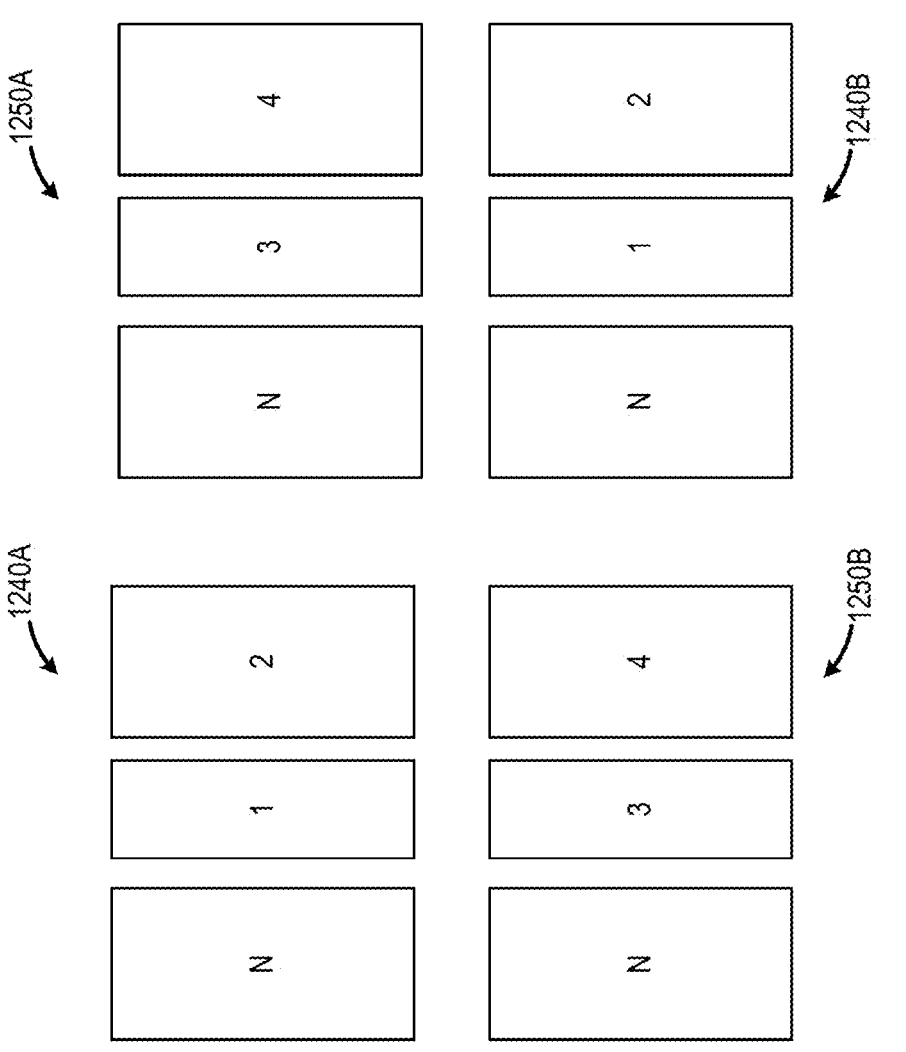

FIGS. 12A-12B illustrate other example sub-pixel arrangements for rendering four pixels in a display panel in accordance with embodiments herein. In particular embodiments, the 2×2 pixel arrangement shown may be repeated to create displays of larger than four pixels, e.g., displays with 1920×1080 pixels, 2560×1440 pixels, 3440×1440 pixels, 3840×2160 pixels, or other display sizes. Referring to FIG. 12A, the example arrangement includes two different sub-pixel arrangements that form distinct pixel types 1210, 1220. The first pixel type 1210 includes three sub-pixels: a first sub-pixel that emits substantially white light (indicated by W), a second sub-pixel that emits substantially green light (indicated by G), and a third sub-pixel that emits substantially red light (indicated by R). The second pixel type 1220 also includes three sub-pixels: a first sub-pixel that emits substantially white light (indicated by W), a second sub-pixel that emits substantially blue light (indicated by B), and a third sub-pixel that emits substantially cyan light (indicated by C). As used herein, substantially cyan light may refer to light with a wavelength between 500-520 nm.

Referring to FIG. 12B, a more general sub-pixel arrangement 1230 is shown with two pixel types 1240, 1250. While the examples below utilize the color sub-pixel color selections shown in FIG. 12A, certain embodiments may utilize different sub-pixel color choices. The first pixel type 1240 includes three sub-pixels: a first sub-pixel that emits neutral light (indicated by N), a second sub-pixel that emits a first color light (indicated by 1), and a third sub-pixel that emits a second color light (indicated by 2). The second pixel type 1250 also includes three sub-pixels: a first sub-pixel that emits neutral light (indicated by N), a second sub-pixel that emits a third color light (indicated by 3), and a third sub-pixel that emits a fourth color light (indicated by 4). The neutral, first, second, third, and fourth colors may be chosen such that a four zone model for rendering colors, e.g., as described below, can be implemented. Each sub-pixel of the example arrangements in FIGS. 12A-12B may include an LED light emission source and may be implemented using a Micro LED structure such as those shown in FIGS. 6-7.

In the examples shown, the respective first, second, and third sub-pixels of each type are the same size as one another; i.e., the first sub-pixel of the first pixel type 1210 is the same size as the first sub-pixel of the second pixel type 1220, the second sub-pixel of the first pixel type 1210 is the same size as the second sub-pixel of the second pixel type 1220, and the third sub-pixel of the first pixel type 1210 is the same size as the third sub-pixel of the second pixel type 120. Further, in the example shown, the first and third sub-pixels of each type 1210, 1220 are the same size while the second sub-pixel of each type 1210, 1220 is half the size of the first and third sub-pixels. However, other embodiments may implement different relative sizes than those shown, and other embodiments may arrange the sub-pixels of each pixel type in a different order/location than as shown. In the example shown, each sub-pixel is rectangularly shaped; however, other shapes of sub-pixels may be implemented in other embodiments, e.g., circular, elliptical, octagonal, etc.

Figure 13:
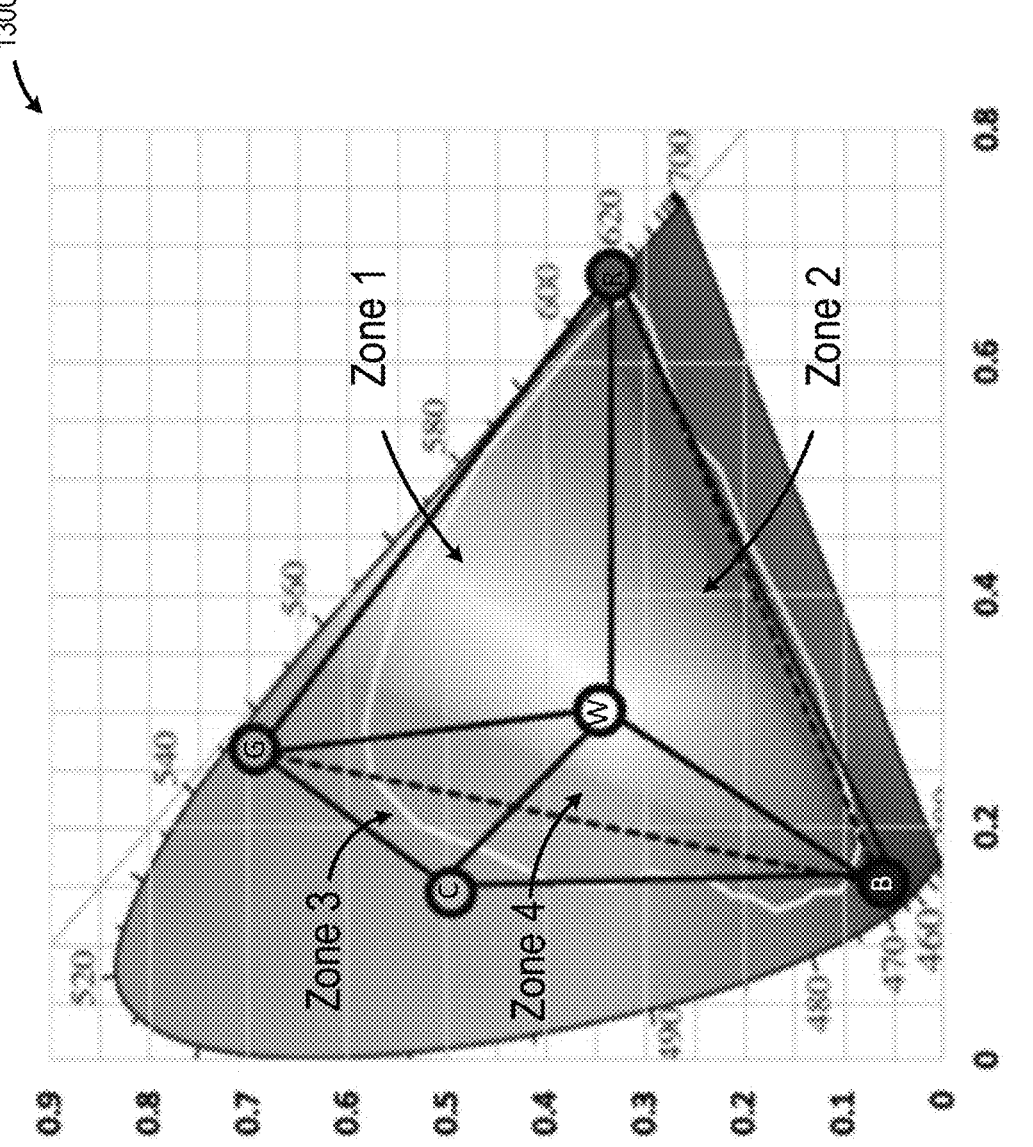
FIG. 13 illustrates an x-y color space diagram indicating example sub-pixel colors for the arrangement in FIG. 12A within the color space.

FIG. 13 illustrates an x-y color space diagram 1300 indicating example sub-pixel colors for the arrangement in FIG. 12A within the color space. In particular, FIG. 13 shows that to render a color in the indicated Zone 1, white, red, and green sub-pixels may be illuminated (with various intensities to achieve a particular color within the zone); to render a color in the indicated Zone 2, white, red, and blue sub-pixels may be illuminated; to render a color in the indicated Zone 3, white, cyan, and green sub-pixels may be illuminated; to render a color in the indicated Zone 4, white, cyan, and blue sub-pixels may be illuminated; and to render a white point, just the white sub-pixel may be illuminated (or in some case, for additional brightness, additional white sub-pixels and/or red, green, and blue sub-pixels from the pixel and surrounding pixels may be illuminated as well). In certain cases, as above, each pixel might not contain sub-pixels with all of the colors needed to render a particular color within a Zone and may "borrow" sub-pixels from neighboring pixels to render the particular color. Examples are described below with respect to FIGS. 14A-14B, 15A-15B, 16A-16B, and 17A-17B, for each Zone indicated in the diagram 1300.

Figure 14A:
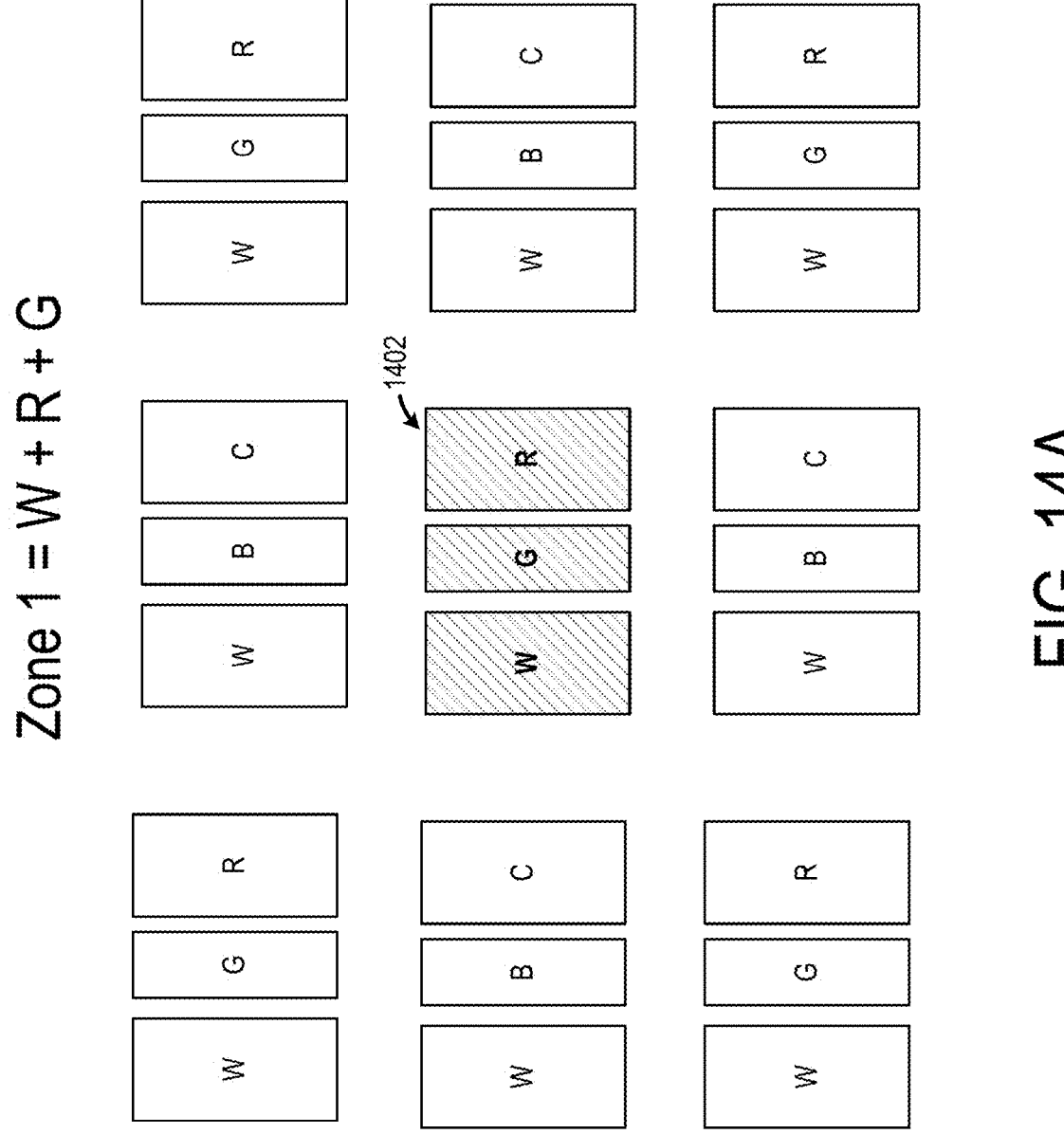
FIGS. 14A-14B illustrate example sub-pixel emission patterns for rendering a color within Zone 1 of the color space diagram of FIG. 13.
Figure 14B:
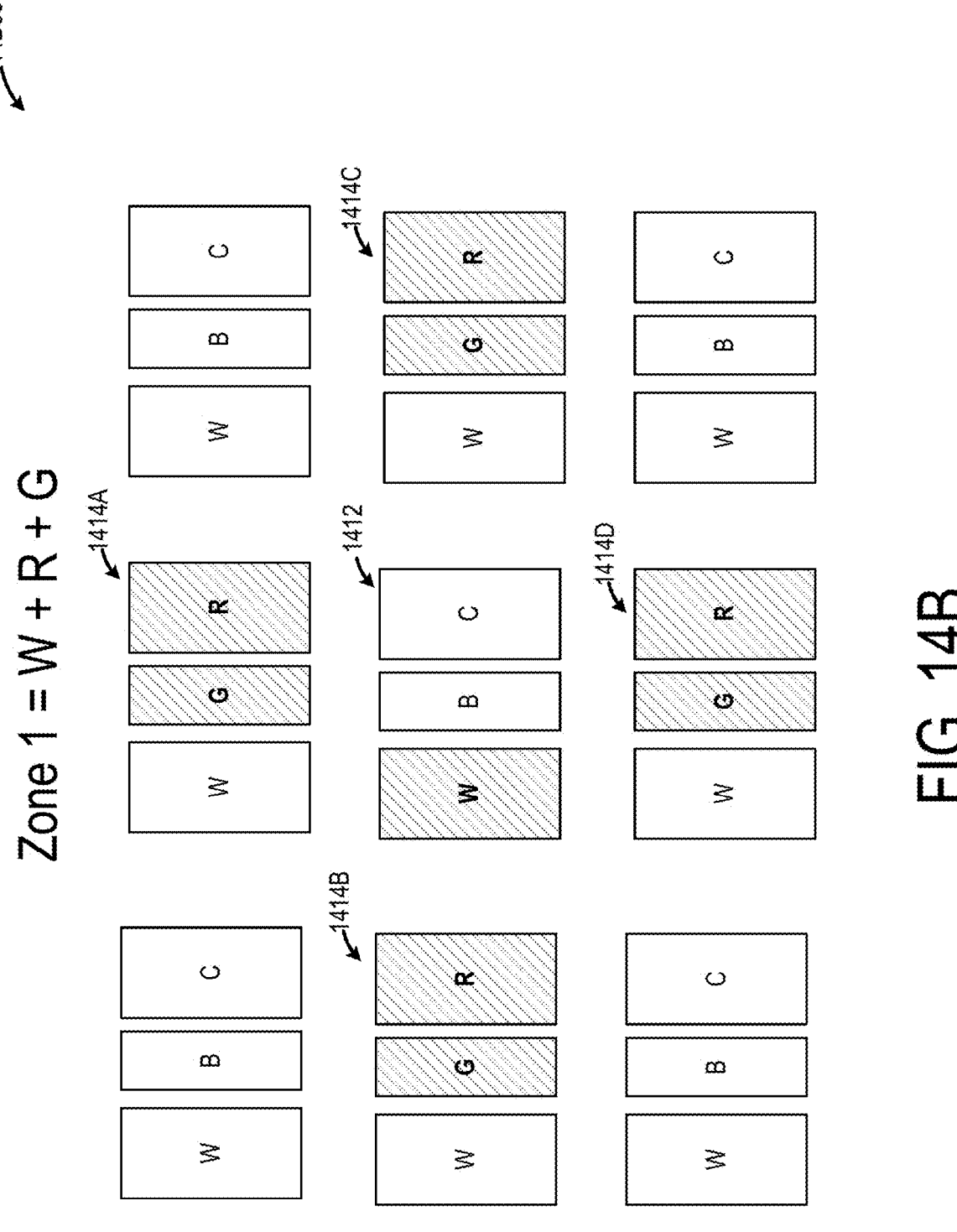

FIGS. 14A-14B illustrate example sub-pixel emission patterns for rendering a color within Zone 1 of the color space diagram 1300 of FIG. 13. As shown in FIG. 13, to render a color in Zone 1 of the color space diagram 1300, white, red, and green sub-pixels may be illuminated. Referring to FIG. 14A, the example pixel 1402 (which is the same as the first pixel type 1210 of FIG. 12) includes the white, green, and red sub-pixels. Thus, each of its sub-pixels may be illuminated to render colors in Zone 1. Referring now to FIG. 14B, the example pixel 1412 (which is the same as the second pixel type 1220 of FIG. 12) includes the white sub-pixel but does not include green or red sub-pixels. Thus, to render colors in Zone 1, the green and red sub-pixels of one or more of the neighboring pixels 1414 may be illuminated along with the white sub-pixel of the pixel 1412.

Figure 15A:
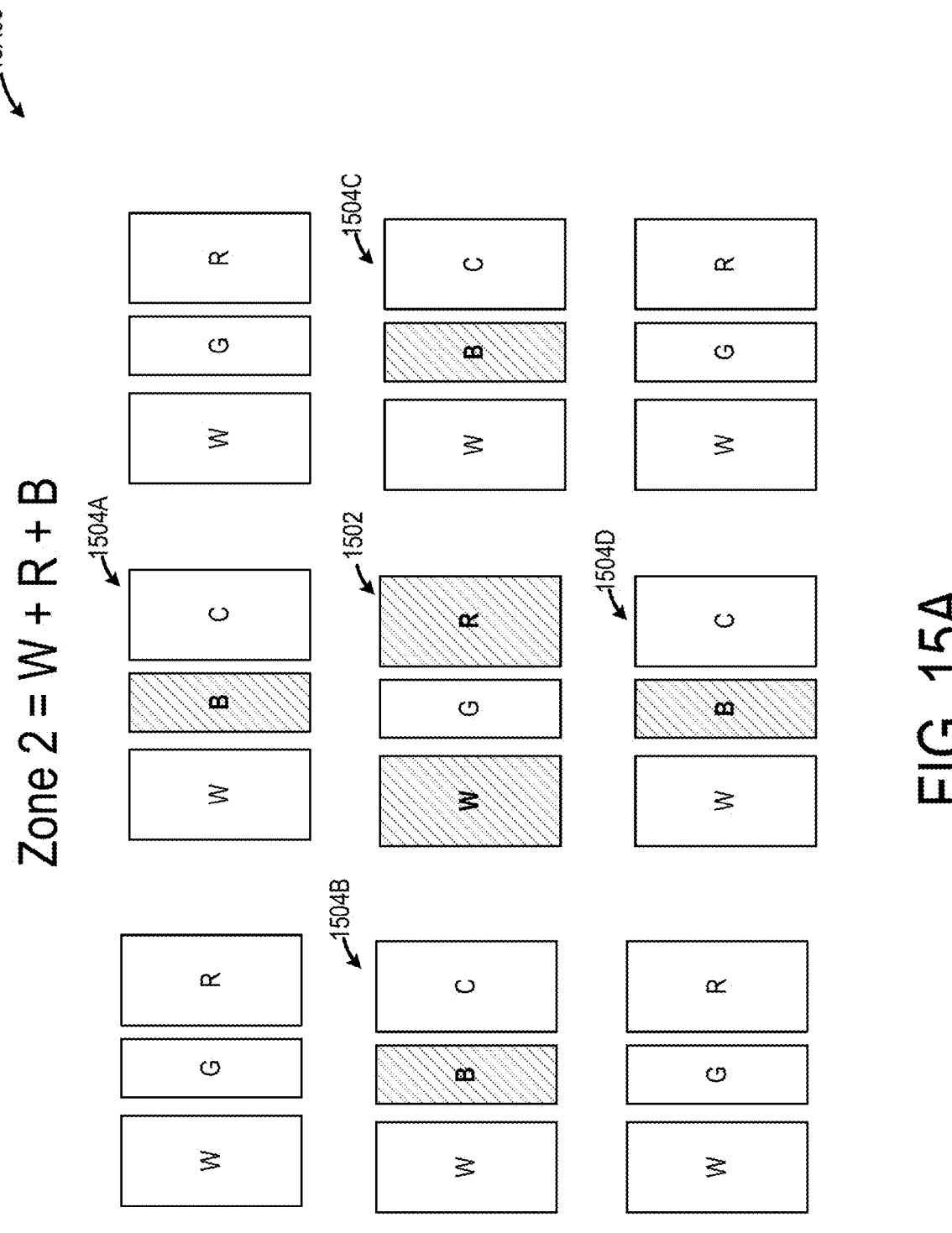
FIGS. 15A-15B illustrate example sub-pixel emission patterns for rendering a color within Zone 2 of the color space diagram of FIG. 13.
Figure 15B:
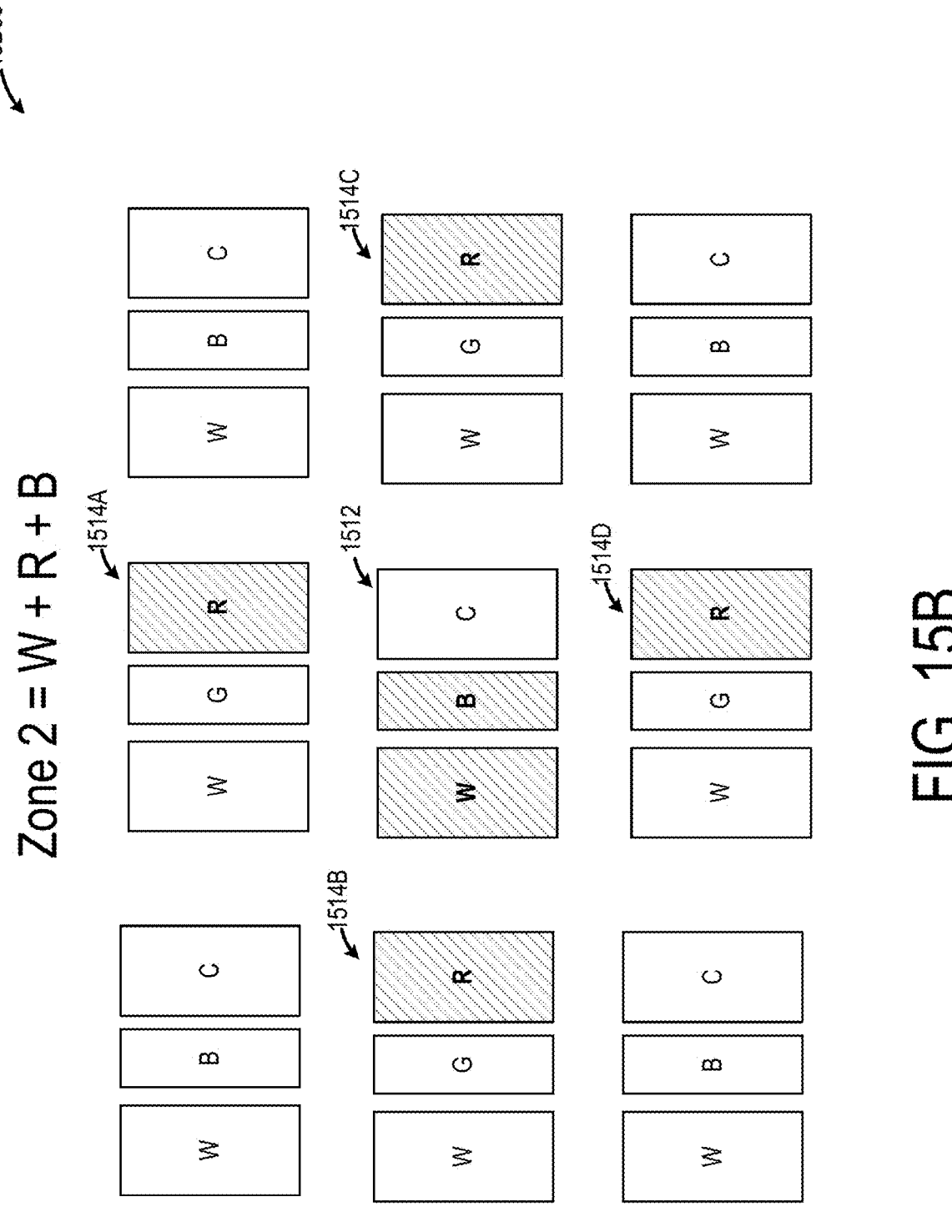

FIGS. 15A-15B illustrate example sub-pixel emission patterns for rendering a color within Zone 2 of the color space diagram 1300 of FIG. 13. As shown in FIG. 13, to render a color in Zone 2 of the color space diagram 1300, white, red, and blue sub-pixels may be illuminated. Referring to FIG. 15A, the example pixel 1502 (which is the same as the first pixel type 1210 of FIG. 12) includes the white and red sub-pixels but no blue sub-pixel. Thus, to render colors in Zone 2, the blue sub-pixels of one or more of the neighboring pixels 1514 may be illuminated along with the white and red sub-pixel of the pixel 1512. Referring now to FIG. 15B, the example pixel 1512 (which is the same as the second pixel type 1220 of FIG. 12) includes the white and blue sub-pixels but does not include a red sub-pixel. Thus, to render colors in Zone 2, the red sub-pixels of one or more of the neighboring pixels 1514 may be illuminated along with the white and blue sub-pixels of the pixel 1512.

Figure 16A:
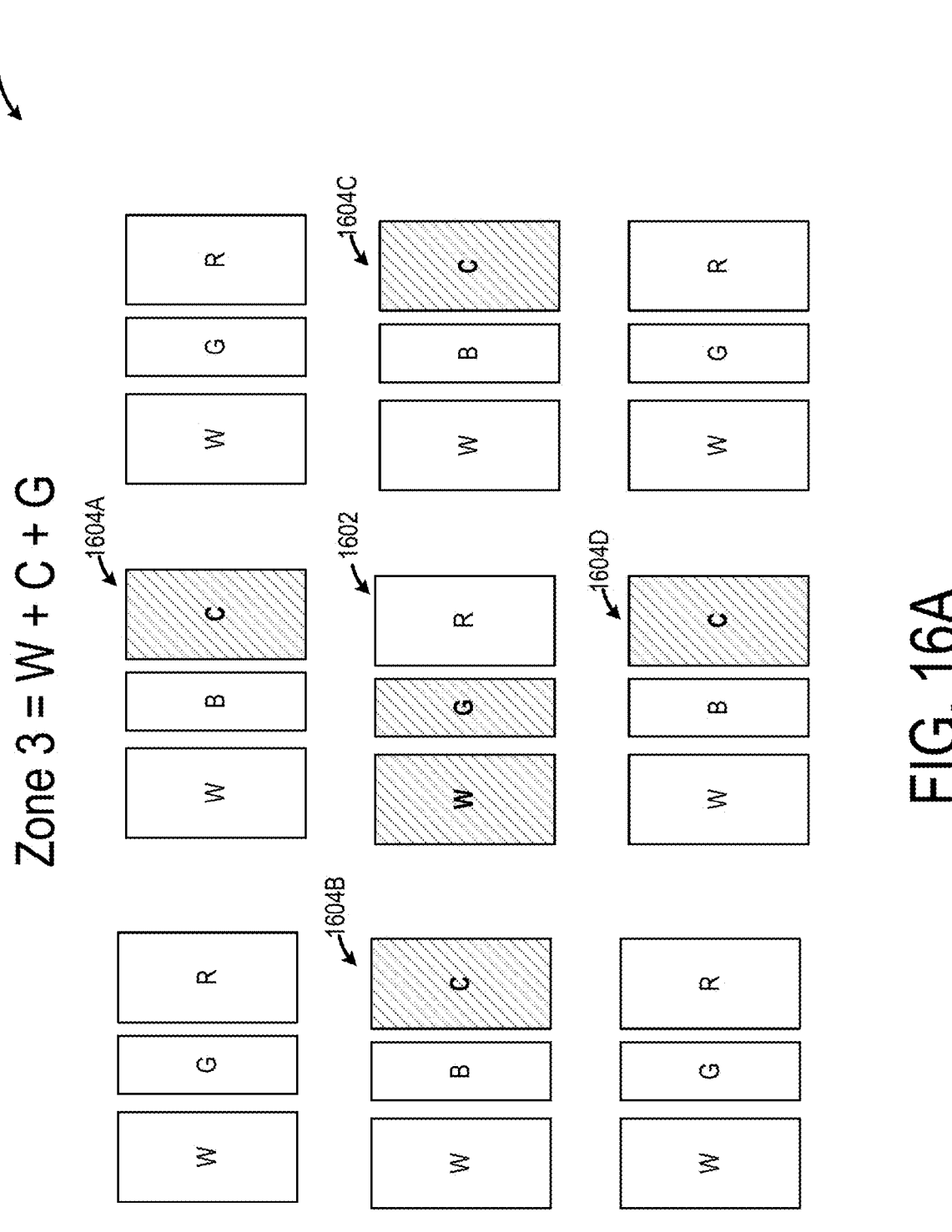
FIGS. 16A-16B illustrate example sub-pixel emission patterns for rendering a color within Zone 3 of the color space diagram of FIG. 13.
Figure 16B:
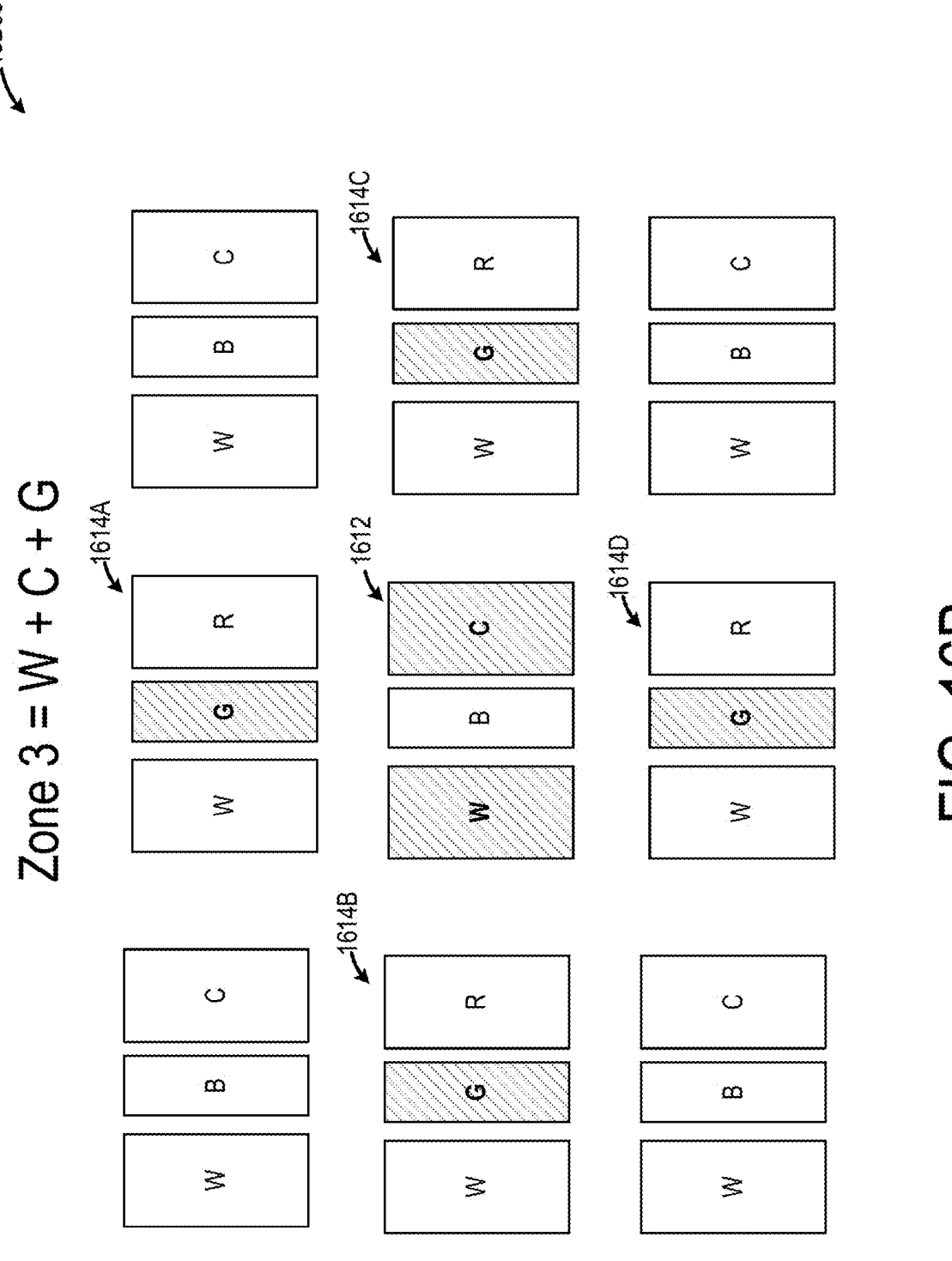

FIGS. 16A-16B illustrate example sub-pixel emission patterns for rendering a color within Zone 3 of the color space diagram 1300 of FIG. 13. As shown in FIG. 13, to render a color in Zone 3 of the color space diagram 1300, white, cyan, and green sub-pixels may be illuminated. Referring to FIG. 16A, the example pixel 1602 (which is the same as the first pixel type 1210 of FIG. 12) includes the white and green sub-pixels but no cyan sub-pixel. Thus, to render colors in Zone 3, the cyan sub-pixels of one or more of the neighboring pixels 1604 may be illuminated along with the white and green sub-pixels of the pixel 1602. Referring now to FIG. 16B, the example pixel 1612 (which is the same as the second pixel type 1220 of FIG. 12) includes the white and cyan sub-pixels but does not include a green sub-pixel. Thus, to render colors in Zone 3, the green sub-pixels of one or more of the neighboring pixels 1614 may be illuminated along with the white and cyan sub-pixels of the pixel 1512.

Figure 17A:
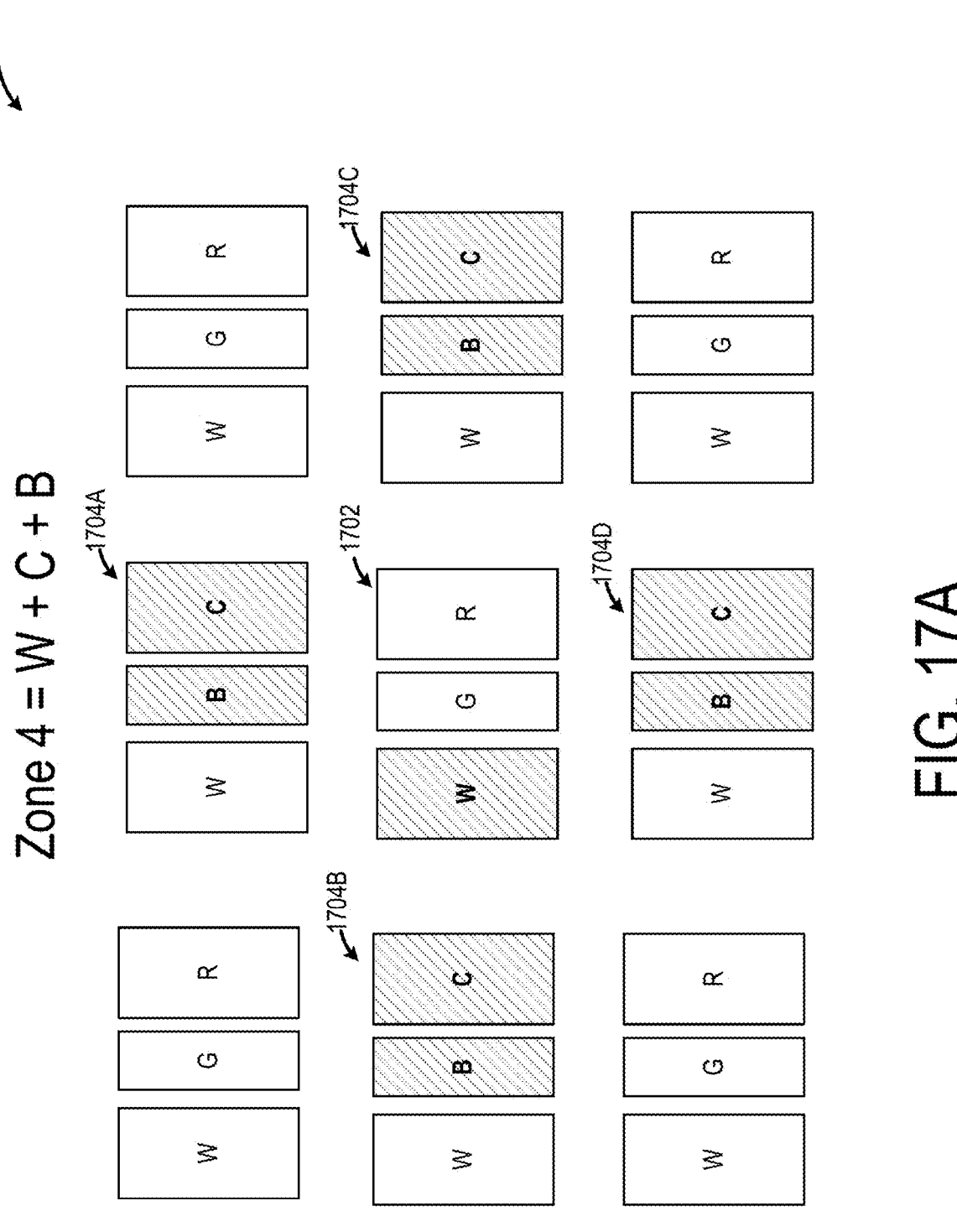
FIGS. 17A-17B illustrate example sub-pixel emission patterns for rendering a color within Zone 4 of the color space diagram of FIG. 13.
Figure 17B:
Figure 17B:
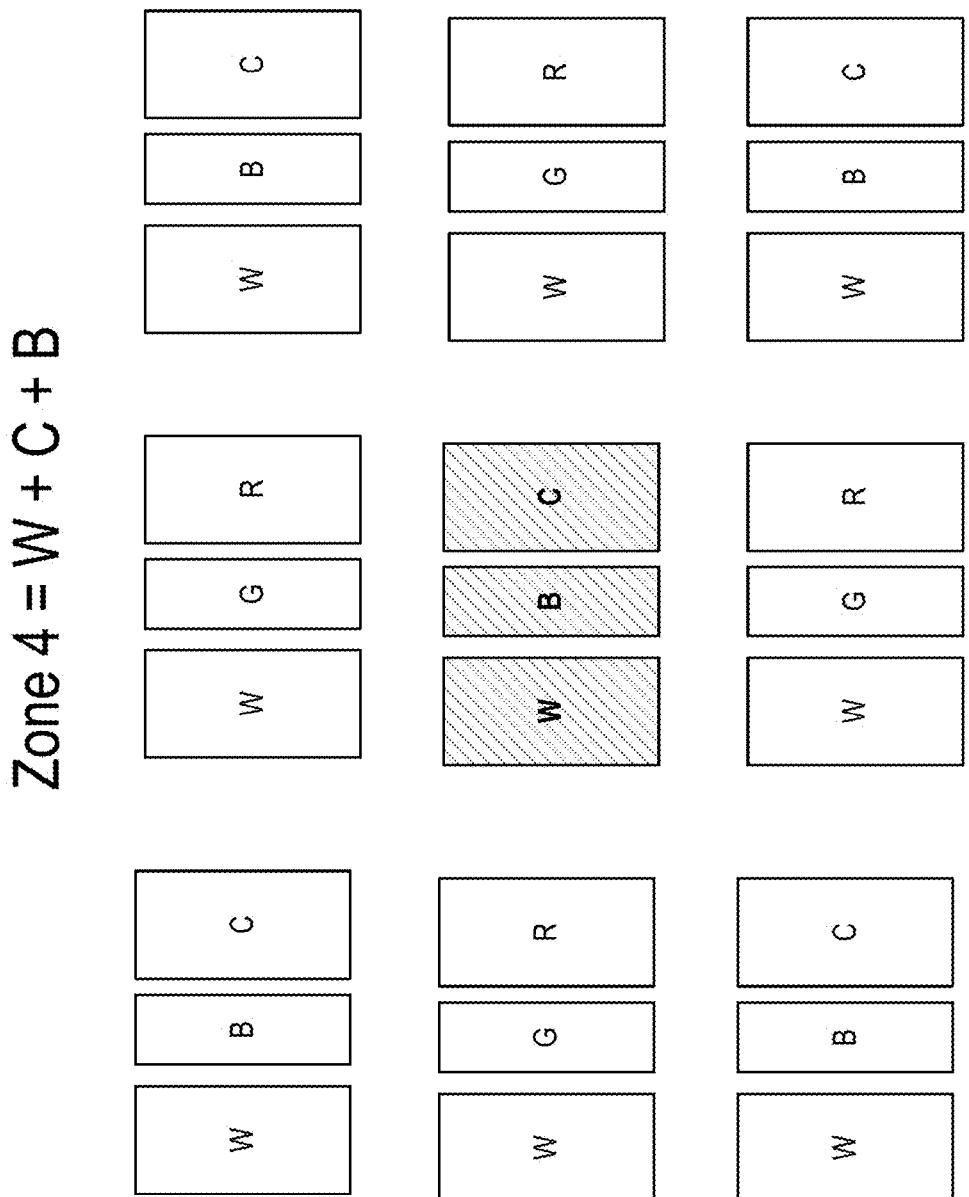

FIGS. 17A-17B illustrate example sub-pixel emission patterns for rendering a color within Zone 4 of the color space diagram 1300 of FIG. 13. As shown in FIG. 13, to render a color in Zone 4 of the color space diagram 1300, white, cyan, and blue sub-pixels may be illuminated. Referring to FIG. 17A, the example pixel 1702 (which is the same as the first pixel type 1210 of FIG. 12) includes a white sub-pixel but no cyan or blue sub-pixels. Thus, to render colors in Zone 4, the cyan and blue sub-pixels of one or more of the neighboring pixels 1704 may be illuminated along with the white sub-pixel of the pixel 1702. Referring now to FIG. 17B, the example pixel 1712 (which is the same as the second pixel type 1220 of FIG. 12) includes the white, blue, and cyan sub-pixels, so each may be illuminated to render colors in Zone 4.

While embodiments herein may be used in any suitable type of computing device or system for streaming display pixel data to a display, the examples below describe example mobile computing devices/environments in which embodiments of the present disclosure can be implemented.

Figure 18:
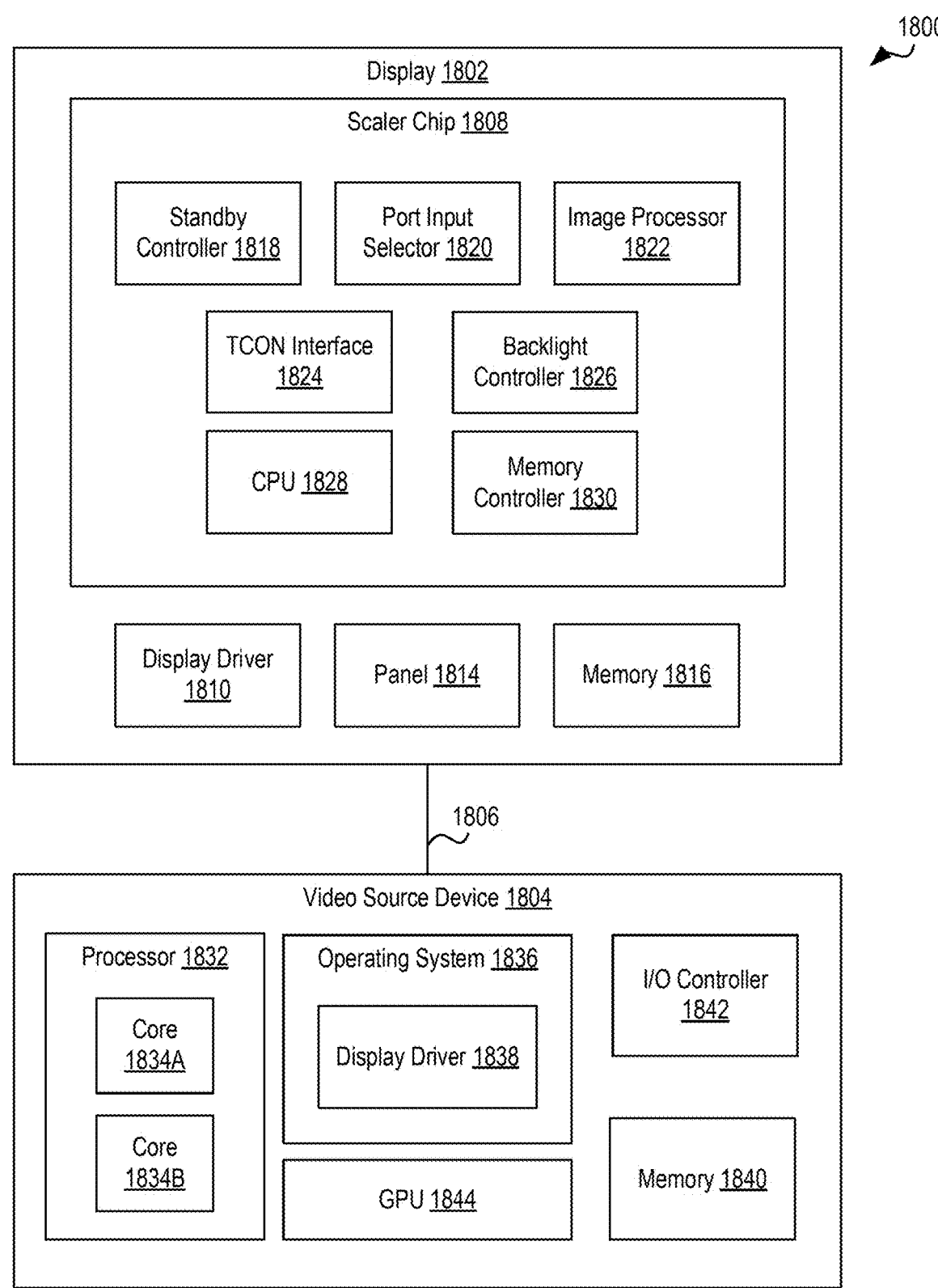
FIG. 18 illustrates a block diagram of an example computing system that can implement embodiments herein.

FIG. 18 illustrates a block diagram of an example computing system 1800 in accordance with certain embodiments. The example computing system 1800 comprises a display 1802 coupled to a video source device 1804 (also referred to herein as a "display source" or "source") via a link 1806. In the example shown, the display 1802 is coupled to a video source device 1804 to display a representation of a video signal received from the video source device 1804. The display 1802 comprises a scaler chip 1808, a display driver 1810, a panel 1814, and a memory 1816. Some embodiments may include a display with any suitable combination of components (including any of those shown or other components). Scaler chip 1808 includes standby controller 1818, port input selector 1820, image processor 1822, timing controller (TCON) interface 1824, backlight controller 1826, central processing unit (CPU) 1828, and memory controller 1830.

Standby controller 1818 is operable to manage operations associated with entry into standby and exit from standby for the display 1802. For example, the standby controller 1818 may coordinate a context save and restore procedure, or the entry into and exit from standby for the display 1802. In various embodiments, standby controller 1818 may coordinate with other components of display 1802. In some embodiments, all or a portion of standby controller 1818 may be integrated within another component of the scaler chip 1808, such as the port input selector 1820 or CPU 1828; or other component of the display 1802. Thus, in some embodiments the standby controller 1818 may be a distinct logic component or may include a collection of logic from various components of the scaler chip 1808 (or other components of the display 1802).

Port input selector 1820 is operable to select a port from among a plurality of ports of the display 1802 and to pass a video signal received through the port to a processing pipeline of the display 1802. The port input selector 1820 may include a port interface that comprises or is coupled to a plurality of ports of the display. The display 1802 may include any number of ports of any type. For example, display 1802 may include a DisplayPort™ port, a High-Definition Multimedia Interface (HDMI™) port, a Universal Serial Bus (USB) port, a Digital Visual Interface (DVI) port, a Video Graphics Array (VGA) port, or other suitable port. Display 1802 may include any suitable combination of ports, including multiple ports of the same type or multiple ports of different types. The port input selector 1820 may include selection logic coupled to the port interface to select a particular port and to pass the signal received through the particular port on to additional logic (e.g., the standby controller 1818, the image processor 1822, etc.). In some embodiments, the port input selector 1820 may also include conversion logic to receive a signal from any of the ports of the display 1802 and convert the signal to a common format (e.g., a digital pixel format) for further processing.

Image processor 1822 may receive a video signal from the port input selector 1820 and perform further processing on the video signal. In some embodiments, the image processor 1822 may execute one or more algorithms to improve the image quality of the video signal. For example, image processor 1822 may perform resolution upscaling, contrast adjustment, color adjustment, or other suitable image processing. In some embodiments, image processor 1822 may superimpose one or more images (e.g., a user menu of the display 1802) on the video signal.

TCON interface 1824 may receive a processed signal from image processor 1822 and convert the signal to a format (e.g., a serial high speed interface format such as Embedded DisplayPort™ (eDP) or V-by-One®) compatible with a TCON of the display driver 1810.

Backlight controller 1826 may include a backlight driver and may generate signals that may be used by the backlight driver to produce current to light up the panel 1814.

CPU 1828 may provide various functions of the display 1802. For example, the CPU 1828 may manage the on-screen display and user configuration adjustments of the display 1802. The CPU 1828 may communicate with other components of the display 1802 (e.g., to bring up a menu or change the brightness of the display in response to a user selection).

Memory controller 1830 may control the transfer of data between one or more components of the scaler chip 1808 and the memory 1816. Memory 1816 may include any suitable volatile or non-volatile memory to support the operations of the display 1802. For example, the memory 1816 may be used to store instructions executed by the components (e.g., CPU 1828, standby controller 1818, image processor 1822, or other component), frame data (e.g., values of pixels), on-screen display data, or other suitable data. In some embodiments, memory 1816 may comprise multiple different memory modules (e.g., each of which may be dedicated to particular types of data) located on any one or more components of the display 1802. For example, in various embodiments, the scaler chip 1808 may include one or more memory modules to support the operation of the scaler chip 1808.

Display driver 1810 may comprise circuitry to receive a video signal and to drive electrical signals to the display elements of the panel 1814 to cause the panel 1814 to display the video. In a particular embodiment, display driver may comprise a TCON. In a particular embodiment, display driver 1810 comprises one or more row and column drivers to drive the display elements. The display driver 1810 may include one or more digital to analog converters (DACs) to produce the appropriate currents to drive the display elements.

In various embodiments, panel 1814 may generate light or allow for the transmission of light in a plurality of pixels. Panel 1814 may comprise a display substrate on which a plurality of pixels are located. The pixels define a display area within which a video signal comprising still images, videos, or other content defined by a video signal can be displayed. Panel 1814 may utilize any suitable display technology, such as, e.g., a thin-film-transistor liquid crystal display (TFT LCD), micro-light emitting diode (micro-LED), organic LED (OLED), quantum dot LED (QLED), or other suitable display technology.

The components of the display 1802 may be arranged in any suitable manner. In one embodiment, a first printed circuit board may comprise the scaler chip 1808 and a second printed circuit board may comprise the display driver 1810 (in some embodiments a separate printed circuit board may house the TCON). In some embodiments, memory 1816 or a portion thereof may be included on the first printed circuit board (or integrated on the scaler chip 1808).

Video source device 1804 may be any suitable computing device to communicate a video signal to the display 1802. For example, video source device 1804 may be a desktop computing system, a laptop computing system, a server computing system, a storage system, a handheld device, a tablet, or other suitable computing device.

In the embodiment depicted, video source device 1804 comprises processor 1832, operating system 1836 (which may be executed by processor 1832), memory 1840, I/O controller 1842, and graphics processing unit (GPU) 1844. Processor 1832 is depicted as including two processing cores 1834A and 1834B, though the processor 1832 may include any suitable number of cores.

The operating system 1836 may execute a display driver 1838 that controls the connection from the video source device 1804 over the link 1806 to the display 1802 and the communication of the video signal (and supporting communications) over the connection.

The GPU 1844 may generate the video signal that is communicated to the display 1802. In the embodiment depicted, the GPU 1844 is a discrete component, though in other embodiments, the GPU 1844 may be integrated with processor 1832.

Memory 1840 may include any suitable volatile or non-volatile memory to support the operations of the display 1802. The memory 1840 may be used to store instructions executed by the components (e.g., processor 1832 or GPU 1844), or other suitable data. In some embodiments, memory 1840 may comprise multiple different memory modules (e.g., each of which may be dedicated to particular types of data) located on any one or more components of the display video source device 1804. In some embodiments, memory 1840 may comprise a system memory.

Link 1806 may comprise any suitable transmission medium operable to communicate analog or digital data between the display 1802 and the video source device 1804. In some embodiments, link 1806 may comprise a cable with a connector on each end. For example, link 1806 may comprise a DisplayPort™ cable, an HDMI™ cable, a USB cable, a DVI cable, a VGA cable, or other suitable cable. In some embodiments, the link 1806 may be an internal connection between the video source device 1804 and the display 1802 (e.g., for notebook computers or other computer systems with connected or embedded displays).

Figure 19:
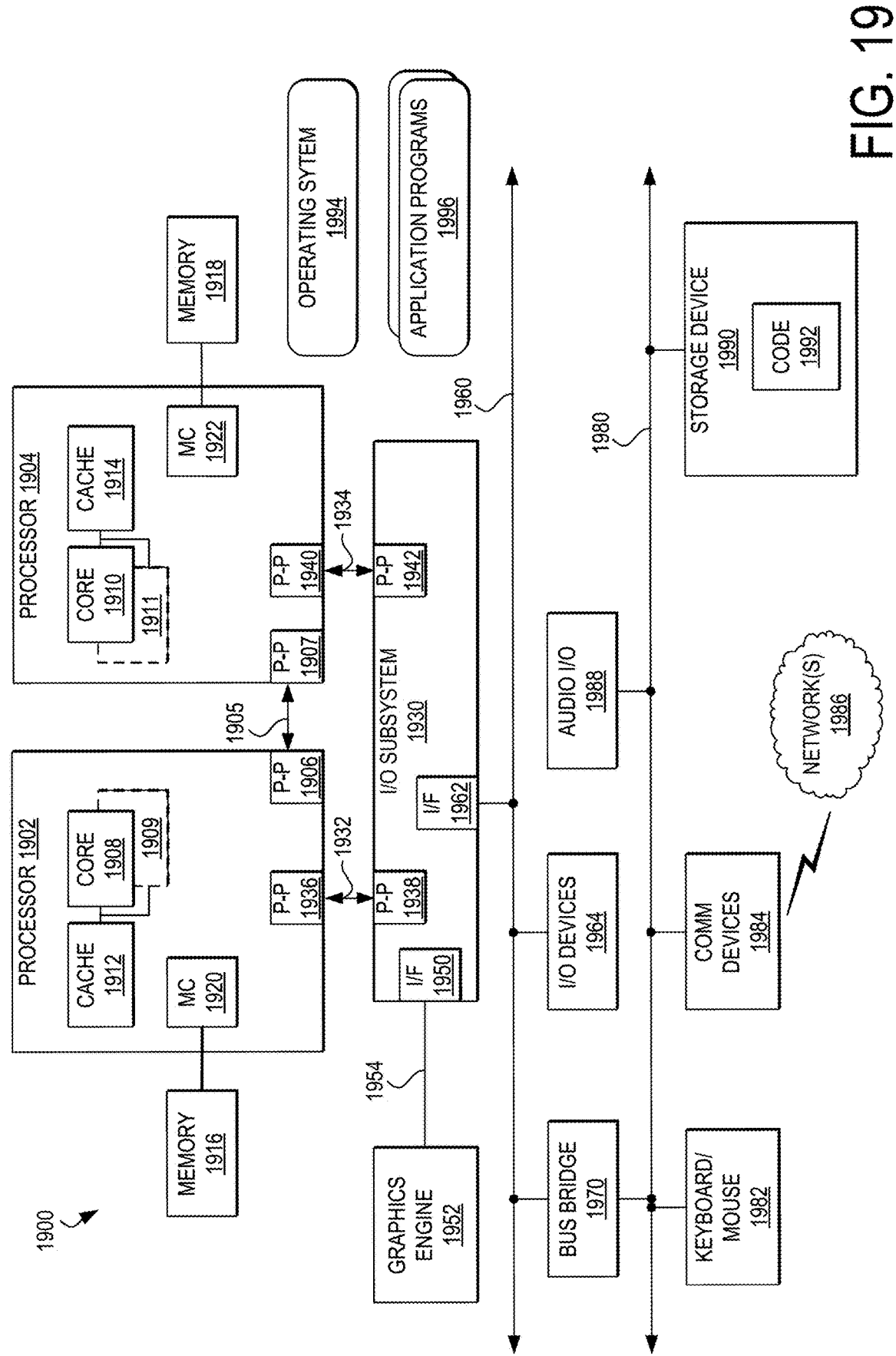
FIG. 19 is a block diagram of example computing device components.

FIG. 19 is a block diagram of example computing device components. Generally, components shown in FIG. 19 can communicate with other shown components, although not all connections are shown, for ease of illustration. The components 1900 comprise a multiprocessor system comprising a first processor 1902 and a second processor 1904 and is illustrated as comprising point-to-point (P-P) interconnects. For example, a point-to-point (P-P) interface 1906 of the processor 1902 is coupled to a point-to-point interface 1907 of the processor 1904 via a point-to-point interconnection 1905. It is to be understood that any or all of the point-to-point interconnects illustrated in FIG. 19 can be alternatively implemented as a multi-drop bus, and that any or all buses illustrated in FIG. 19 could be replaced by point-to-point interconnects.

As shown in FIG. 19, the processors 1902 and 1904 are multicore processors. Processor 1902 comprises processor cores 1908 and 1909, and processor 1904 comprises processor cores 1910 and 1911. Processor cores 1908-1911 can execute computer-executable instructions.

Processors 1902 and 1904 further comprise at least one shared cache memory 1912 and 1914, respectively. The shared caches 1912 and 1914 can store data (e.g., instructions) utilized by one or more components of the processor, such as the processor cores 1908-1909 and 1910-1911. The shared caches 1912 and 1914 can be part of a memory hierarchy for the device. For example, the shared cache 1912 can locally store data that is also stored in a memory 1916 to allow for faster access to the data by components of the processor 1902. In some embodiments, the shared caches 1912 and 1914 can comprise multiple cache layers, such as level 1 (L1), level 2 (L2), level 3 (L3), level 4 (L4), and/or other caches or cache layers, such as a last level cache (LLC).

Although two processors are shown, the device can comprise any number of processors or other compute resources. Further, a processor can comprise any number of processor cores. A processor can take various forms such as a central processing unit, a controller, a graphics processor, an accelerator (such as a graphics accelerator, digital signal processor (DSP), or AI accelerator)). A processor in a device can be the same as or different from other processors in the device. In some embodiments, the device can comprise one or more processors that are heterogeneous or asymmetric to a first processor, accelerator, FPGA, or any other processor. There can be a variety of differences between the processing elements in a system in terms of a spectrum of metrics of merit including architectural, microarchitectural, thermal, power consumption characteristics and the like. These differences can effectively manifest themselves as asymmetry and heterogeneity amongst the processors in a system. In some embodiments, the processors 1902 and 1904 reside in a multi-chip package. As used herein, the terms "processor unit" and "processing unit" can refer to any processor, processor core, component, module, engine, circuitry or any other processing element described herein. A processor unit or processing unit can be implemented in hardware, software, firmware, or any combination thereof capable of.

Processors 1902 and 1904 further comprise memory controller logic (MC) 1920 and 1922. As shown in FIG. 19, MCs 1920 and 1922 control memories 1916 and 1918 coupled to the processors 1902 and 1904, respectively. The memories 1916 and 1918 can comprise various types of memories, such as volatile memory (e.g., dynamic random-access memories (DRAM), static random-access memory (SRAM)) or non-volatile memory (e.g., flash memory, solid-state drives, chalcogenide-based phase-change non-volatile memories). While MCs 1920 and 1922 are illustrated as being integrated into the processors 1902 and 1904, in alternative embodiments, the MCs can be logic external to a processor, and can comprise one or more layers of a memory hierarchy.

Processors 1902 and 1904 are coupled to an Input/Output (I/O) subsystem 1930 via P-P interconnections 1932 and 1934. The point-to-point interconnection 1932 connects a point-to-point interface 1936 of the processor 1902 with a point-to-point interface 1938 of the I/O subsystem 1930, and the point-to-point interconnection 1934 connects a point-to-point interface 1940 of the processor 1904 with a point-to-point interface 1942 of the I/O subsystem 1930. Input/Output subsystem 1930 further includes an interface 1950 to couple I/O subsystem 1930 to a graphics module 1952, which can be a high-performance graphics module. The I/O subsystem 1930 and the graphics module 1952 are coupled via a bus 1954. Alternately, the bus 1954 could be a point-to-point interconnection.

Input/Output subsystem 1930 is further coupled to a first bus 1960 via an interface 1962. The first bus 1960 can be a Peripheral Component Interconnect (PCI) bus, a PCI Express bus, another third generation I/O interconnection bus or any other type of bus.

Various I/O devices 1964 can be coupled to the first bus 1960. A bus bridge 1970 can couple the first bus 1960 to a second bus 1980. In some embodiments, the second bus 1980 can be a low pin count (LPC) bus. Various devices can be coupled to the second bus 1980 including, for example, a keyboard/mouse 1982, audio I/O devices 1988 and a storage device 1990, such as a hard disk drive, solid-state drive or other storage device for storing computer-execut-able instructions (code) 1992. The code 1992 can comprise computer-executable instructions for performing technolo-gies described herein. Additional components that can be coupled to the second bus 1980 include communication device(s) or unit(s) 1984, which can provide for communi-cation between the device and one or more wired or wireless networks 1986 (e.g. Wi-Fi, cellular or satellite networks) via one or more wired or wireless communication links (e.g., wire, cable, Ethernet connection, radio-frequency (RF) channel, infrared channel, Wi-Fi channel) using one or more communication standards (e.g., IEEE 802.11 standard and its supplements).

The device can comprise removable memory such as flash memory cards (e.g., SD (Secure Digital) cards), memory sticks, Subscriber Identity Module (SIM) cards). The memory in the computing device (including caches 1912 and 1914, memories 1916 and 1918 and storage device 1990) can store data and/or computer-executable instruc-tions for executing an operating system 1994, or application programs 1996. Example data includes web pages, text messages, images, sound files, video data, sensor data, or other data sets to be sent to and/or received from one or more network servers or other devices by the device via one or more wired or wireless networks, or for use by the device. The device can also have access to external memory (not shown) such as external hard drives or cloud-based storage.

The operating system 1994 can control the allocation and usage of the components illustrated in FIG. 19 and support one or more application programs 1996. The application programs 1996 can include common mobile computing device applications (e.g., email applications, calendars, con-tact managers, web browsers, messaging applications) as well as other computing applications.

The device can support various input devices, such as a touchscreen, microphones, cameras (monoscopic or stereo-scopic), trackball, touchpad, trackpad, mouse, keyboard, proximity sensor, light sensor, pressure sensor, infrared sensor, electrocardiogram (ECG) sensor, PPG (photopl-ethysmogram) sensor, galvanic skin response sensor, and one or more output devices, such as one or more speakers or displays. Any of the input or output devices can be internal to, external to or removably attachable with the device. External input and output devices can communicate with the device via wired or wireless connections.

In addition, the computing device can provide one or more natural user interfaces (NUIs). For example, the oper-ating system 1994 or applications 1996 can comprise speech recognition as part of a voice user interface that allows a user to operate the device via voice commands. Further, the device can comprise input devices and components that allows a user to interact with the device via body, hand, or face gestures.

The device can further comprise one or more communi-cation components 1984. The components 1984 can com-prise wireless communication components coupled to one or more antennas to support communication between the device and external devices. Antennas can be located in a base, lid, or other portion of the device. The wireless communication components can support various wireless communication protocols and technologies such as Near Field Communication (NFC), IEEE 1002.11 (Wi-Fi) vari-ants, WiMax, Bluetooth, Zigbee, 4G Long Term Evolution (LTE), Code Division Multiplexing Access (CDMA), Uni-versal Mobile Telecommunication System (UMTS) and Global System for Mobile Telecommunication (GSM). In addition, the wireless modems can support communication with one or more cellular networks for data and voice communications within a single cellular network, between cellular networks, or between the mobile computing device and a public switched telephone network (PSTN).

The device can further include at least one input/output port (which can be, for example, a USB, IEEE 1394 (Fire-Wire), Ethernet and/or RS-232 port) comprising physical connectors; a power supply (such as a rechargeable battery); a satellite navigation system receiver, such as a GPS receiver; a gyroscope; an accelerometer; and a compass. A GPS receiver can be coupled to a GPS antenna. The device can further include one or more additional antennas coupled to one or more additional receivers, transmitters and/or transceivers to enable additional functions.

FIG. 19 illustrates one example computing device archi-tecture. Computing devices based on alternative architec-tures can be used to implement technologies described herein. For example, instead of the processors 1902 and 1904, and the graphics module 1952 being located on discrete integrated circuits, a computing device can com-prise a SoC (system-on-a-chip) integrated circuit incorpo-rating one or more of the components illustrated in FIG. 19. In one example, an SoC can comprise multiple processor cores, cache memory, a display driver, a GPU, multiple I/O controllers, an AI accelerator, an image processing unit driver, I/O controllers, an AI accelerator, an image processor unit. Further, a computing device can connect elements via bus or point-to-point configurations different from that shown in FIG. 19. Moreover, the illustrated components in FIG. 19 are not required or all-inclusive, as shown compo-nents can be removed and other components added in alternative embodiments.

As used in any embodiment herein, the term "module" refers to logic that may be implemented in a hardware component or device, software or firmware running on a processor, or a combination thereof, to perform one or more operations consistent with the present disclosure. Software may be embodied as a software package, code, instructions, instruction sets and/or data recorded on non-transitory com-puter-readable storage mediums. Firmware may be embod-ied as code, instructions or instruction sets and/or data that are hard-coded (e.g., nonvolatile) in memory devices. As used in any embodiment herein, the term "circuitry" can comprise, for example, singly or in any combination, hard-wired circuitry, programmable circuitry such as computer processors comprising one or more individual instruction processing cores, state machine circuitry, and/or firmware that stores instructions executed by programmable circuitry. Modules described herein may, collectively or individually, be embodied as circuitry that forms a part of one or more devices. Thus, any of the modules can be implemented as circuitry, such as continuous itemset generation circuitry, entropy-based discretization circuitry, etc. A computer device referred to as being programmed to perform a method can be programmed to perform the method via software, hardware, firmware or combinations thereof.

The use of reference numbers in the claims and the specification is meant as in aid in understanding the claims and the specification and is not meant to be limiting.

Any of the disclosed methods can be implemented as computer-executable instructions or a computer program product. Such instructions can cause a computer or one or more processors capable of executing computer-executable instructions to perform any of the disclosed methods. Generally, as used herein, the term "computer" refers to any computing device or system described or mentioned herein, or any other computing device. Thus, the term "computer-executable instruction" refers to instructions that can be executed by any computing device described or mentioned herein, or any other computing device.

The computer-executable instructions or computer program products as well as any data created and used during implementation of the disclosed technologies can be stored on one or more tangible or non-transitory computer-readable storage media, such as optical media discs (e.g., DVDs, CDs), volatile memory components (e.g., DRAM, SRAM), or non-volatile memory components (e.g., flash memory, solid state drives, chalcogenide-based phase-change non-volatile memories). Computer-readable storage media can be contained in computer-readable storage devices such as solid-state drives, USB flash drives, and memory modules. Alternatively, the computer-executable instructions may be performed by specific hardware components that contain hardwired logic for performing all or a portion of disclosed methods, or by any combination of computer-readable storage media and hardware components.

The computer-executable instructions can be part of, for example, a dedicated software application or a software application that is accessed via a web browser or other software application (such as a remote computing application). Such software can be read and executed by, for example, a single computing device or in a network environment using one or more networked computers. Further, it is to be understood that the disclosed technology is not limited to any specific computer language or program. For instance, the disclosed technologies can be implemented by software written in C++, Java, Perl, Python, JavaScript, Adobe Flash, or any other suitable programming language. Likewise, the disclosed technologies are not limited to any particular computer or type of hardware.

Furthermore, any of the software-based embodiments (comprising, for example, computer-executable instructions for causing a computer to perform any of the disclosed methods) can be uploaded, downloaded or remotely accessed through a suitable communication means. Such suitable communication means include, for example, the Internet, the World Wide Web, an intranet, cable (including fiber optic cable), magnetic communications, electromagnetic communications (including RF, microwave, and infrared communications), electronic communications, or other such communication means.

As used in this application and in the claims, a list of items joined by the term "and/or" can mean any combination of the listed items. For example, the phrase "A, B and/or C" can mean A; B; C; A and B; A and C; B and C; or A, B, and C. Further, as used in this application and in the claims, a list of items joined by the term "at least one of" can mean any combination of the listed terms. For example, the phrase "at least one of A, B, or C" can mean A; B; C; A and B; A and C; B and C; or A, B, and C. Moreover, as used in this application and in the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses and systems are not to be construed as limiting in any way. Instead, the present disclosure is directed toward all novel and nonobvious features and aspects of the various disclosed embodiments, alone and in various combinations and subcombinations with one another. The disclosed methods, apparatuses, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it is to be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Additional examples of the presently described display pixel data streaming techniques include the following, non-limiting implementations. Each of the following non-limiting examples may stand on its own or may be combined in any permutation or combination with any one or more of the other examples provided below or throughout the present disclosure.

Example 1 includes a display comprising: a display panel comprising a plurality of pixels arranged in rows and columns, the plurality of pixels comprising a first pixel type and a second pixel type, the first pixel type and second pixel type alternating in each row and in each column, wherein: the first pixel type comprises: a first sub-pixel to emit a neutral (e.g., substantially white) light; a second sub-pixel to emit a first color (e.g., substantially green) light; and a third sub-pixel to emit a second (e.g., substantially red) light; and the second pixel type comprises: a first sub-pixel to emit the neutral (e.g., substantially white) light; a second sub-pixel to emit a third color (e.g., substantially blue) light; and a third sub-pixel to emit the first color (e.g., substantially red) light.

Example 2 includes the subject matter of Example 1, wherein the second sub-pixels of the first pixel type and the second pixel type are half the size of the first sub-pixels of the first pixel type and the second pixel type.

Example 3 includes the subject matter of Examples 1-2, wherein the third sub-pixels of the first pixel type and the second pixel type are the same size as the first sub-pixels of the first pixel type and the second pixel type.

Example 4 includes the subject matter of any one of Examples 1-2, wherein the third sub-pixels of the first pixel type and the second pixel type are half the size of the first sub-pixels of the first pixel type and the second pixel type.

Example 5 includes the subject matter of any one of Examples 1-4, wherein: the sub-pixels to emit substantially white light and the sub-pixels to emit substantially red light each comprise: a light emitting diode (LED) that emits substantially blue light; a color convert material proximate to the LED, the color convert material comprising one of quantum dots or phosphors; and a color filter above the LED and the color convert material; and the sub-pixels to emit substantially blue light each comprise a LED that emits substantially blue light and a color filter above the LED.

Example 6 includes the subject matter of Example 5, wherein the sub-pixels to emit substantially green light each comprise a LED that emits substantially green light and a color filter above the LED.

Example 7 includes the subject matter of Example 5, wherein the sub-pixels to emit substantially green light each comprise a LED that emits substantially blue light, a color convert material proximate to the LED, and a color filter above the LED.

Example 8 includes the subject matter of any one of Examples 1-7, wherein the shape of each sub-pixel is rectangular.

Example 9 includes the subject matter of any one of Examples 1-8, further comprising control circuitry to control actuation of the sub-pixels of the display panel to cause each pixel to display a particular color based on input signal from a graphics source, the control circuitry to: cause a pixel of the first pixel type to: emit a color in a first color zone by illuminating the first sub-pixel of the pixel, the second sub-pixel of the pixel, and second sub-pixels of one or more neighboring pixels of the second pixel type; emit a color in a second color zone by illuminating the first sub-pixel of the pixel, the second sub-pixel of the pixel, and the third sub-pixel of the pixel; and emit a color in a third color zone by illuminating the first sub-pixel of the pixel, the third sub-pixel of the pixel, and second sub-pixels of one or more neighboring pixels of the second pixel type; and cause a pixel of the second pixel type to: emit a color in a first color zone by illuminating the first sub-pixel of the pixel, the second sub-pixel of the pixel, and second sub-pixels of one or more neighboring pixels of the first pixel type; emit a color in a second color zone by illuminating the first sub-pixel of the pixel, the third sub-pixel of the pixel, and second sub-pixels of one or more neighboring pixels of the first pixel type; and emit a color in a third color zone by illuminating the first sub-pixel of the pixel, the second sub-pixel of the pixel, and the third sub-pixel of the pixel.

Example 10 includes the subject matter of Example 9, wherein the control circuitry is to control actuation of the sub-pixels using amplitude modulation.

Example 11 is a display comprising: a display panel comprising a plurality of pixels arranged in rows and columns, the plurality of pixels comprising a first pixel type and a second pixel type, the first pixel type and second pixel type alternating in each row and in each column, wherein: the first pixel type comprises: a first sub-pixel to emit neutral (e.g., substantially white) light; a second sub-pixel to emit a first color (e.g., substantially red) light; and portions of multiple shared sub-pixels than emit a third color (e.g., substantially green) light and span multiple pixels of the display panel; the second pixel type comprises: a first sub-pixel to emit the neutral (e.g., substantially white) light; a second sub-pixel to emit a second color (e.g., substantially blue) light; and portions of multiple shared sub-pixels than emit the third color (e.g., substantially green) light and span multiple pixels of the display panel.

Example 12 includes the subject matter of Example 11, wherein the portions of the multiple respective sub-pixels comprise quarters of sub-pixels located at corners of the pixel and span four pixels of the display panel.

Example 13 includes the subject matter of any one of Examples 11-12, wherein the sub-pixels to emit substantially white light, the sub-pixels to emit substantially red light, and the sub-pixels to emit substantially blue light are the same size.

Example 14 includes the subject matter of Example 13, wherein the shared sub-pixels are a different size than the sub-pixels to emit substantially white light, the sub-pixels to emit substantially red light, and the sub-pixels to emit substantially blue light are the same size.

Example 15 includes the subject matter of any one of Examples 11-14, wherein: the sub-pixels to emit substantially white light and the sub-pixels to emit substantially red light each comprise: a light emitting diode (LED) that emits substantially blue light; a color convert material proximate to the LED, the color convert material comprising one of quantum dots or phosphors; and a color filter above the LED and the color convert material; and the sub-pixels to emit substantially blue light each comprise a LED that emits substantially blue light and a color filter above the LED.

Example 16 includes the subject matter of Example 15, wherein the sub-pixels to emit substantially green light each comprise a LED that emits substantially green light and a color filter above the LED.

Example 17 includes the subject matter of Example 15, wherein the sub-pixels to emit substantially green light each comprise a LED that emits substantially blue light, a color convert material proximate to the LED, and a color filter above the LED.

Example 18 includes the subject matter of any one of Examples 11-17, wherein each sub-pixel is octagonal in shape.

Example 19 includes the subject matter of any one of Examples 11-18, further comprising control circuitry to control actuation of the sub-pixels of the display panel to cause each pixel to display a particular color based on input signal from a graphics source, the control circuitry is to: cause a pixel of the first pixel type to: emit a color in a first color zone by illuminating the first sub-pixel of the pixel, second sub-pixels of one or more neighboring pixels of the second pixel type, and the shared sub-pixels whose portions are in the pixel; emit a color in a second color zone by illuminating the first and second sub-pixels of the pixel and the shared sub-pixels whose portions are in the pixel; and emit a color in a third color zone by illuminating the first and second sub-pixels of the pixel and second sub-pixels of one or more neighboring pixels of the second pixel type; and cause a pixel of the second pixel type to: emit a color in a first color zone by illuminating the first and second sub-pixels of the pixel and the shared sub-pixels whose portions are in the pixel; emit a color in a second color zone by illuminating the first sub-pixel of the pixel, second sub-pixels of one or more neighboring pixels of the first pixel type, and the shared sub-pixels whose portions are in the pixel; and emit a color in a third color zone by illuminating the first and second sub-pixels of the pixel and second sub-pixels of one or more neighboring pixels of the first pixel type.

Example 20 includes the subject matter of Example 19, wherein the control circuitry is to control actuation of the sub-pixels using amplitude modulation.

Example 21 is a display comprising: a display panel comprising a plurality of pixels arranged in rows and columns, the plurality of pixels comprising a first pixel type and a second pixel type, the first pixel type and second pixel type alternating in each row and in each column, wherein: the first pixel type comprises: a first sub-pixel to emit neutral (e.g., substantially white) light; a second sub-pixel to emit a first color (e.g., substantially green) light; and a third sub-pixel to emit a second color (e.g., substantially red) light; and the second pixel type comprises: a first sub-pixel to emit the neutral (e.g., substantially white) light; a second subpixel to emit a third color (e.g., substantially blue) light; and a third sub-pixel to emit a fourth color (e.g., substantially cyan) light.

Example 22 includes the subject matter of any one of Examples 21-18, wherein the second sub-pixels of the first pixel type and the second pixel type are half the size of the first sub-pixels of the first pixel type and the second pixel type.

Example 23 includes the subject matter of any one of Examples 21-19, wherein the third sub-pixels of the first pixel type and the second pixel type are the same size as the first sub-pixels of the first pixel type and the second pixel type.

Example 24 includes the subject matter of any one of Examples 21-19, wherein the third sub-pixels of the first pixel type and the second pixel type are half the size of the first sub-pixels of the first pixel type and the second pixel type.

Example 25 includes the subject matter of any one of Examples 21-24, wherein: the sub-pixels to emit substantially white light and the sub-pixels to emit substantially red light each comprise: a light emitting diode (LED) that emits substantially blue light; a color convert material proximate to the LED, the color convert material comprising one of quantum dots or phosphors; and a color filter above the LED and the color convert material; and the sub-pixels to emit substantially blue light each comprise a LED that emits substantially blue light and a color filter above the LED.

Example 26 includes the subject matter of Example 25, wherein the sub-pixels to emit substantially green light each comprise a LED that emits substantially green light and a color filter above the LED.

Example 27 includes the subject matter of Example 25, wherein the sub-pixels to emit substantially green light each comprise a LED that emits substantially blue light, a color convert material proximate to the LED, and a color filter above the LED.

Example 28 includes the subject matter of any one of Examples 21-27, wherein the shape of each sub-pixel is rectangular.

Example 29 includes the subject matter of any one of Examples 21-27, further comprising control circuitry to control actuation of the sub-pixels of the display panel to cause each pixel to display a particular color based on input signal from a graphics source, the control circuitry is to: cause a pixel of the first pixel type to: emit a color in a first color zone by illuminating the first sub-pixel of the pixel, the second sub-pixel of the pixel, and the third sub-pixel of the pixel; emit a color in a second color zone by illuminating the first sub-pixel of the pixel, the third sub-pixel of the pixel, and second sub-pixels of one or more neighboring pixels of the second pixel type; and emit a color in a third color zone by illuminating the first sub-pixel of the pixel, the second sub-pixel of the pixel, and third sub-pixels of one or more neighboring pixels of the second pixel type; emit a color in a fourth color zone by illuminating the first sub-pixel of the pixel, second sub-pixels of one or more neighboring pixels of the second pixel type, and third sub-pixels of one or more neighboring pixels of the second pixel type; and cause a pixel of the second pixel type to: emit a color in a first color zone by illuminating the first sub-pixel of the pixel, second sub-pixels of one or more neighboring pixels of the first pixel type, and third sub-pixels of one or more neighboring pixels of the first pixel type; emit a color in a second color zone by illuminating the first sub-pixel of the pixel, the second sub-pixel of the pixel, and third sub-pixels of one or more neighboring pixels of the first pixel type; emit a color in a third color zone by illuminating the first sub-pixel of the pixel, the third sub-pixel of the pixel, and second sub-pixels of one or more neighboring pixels of the first pixel type; and emit a color in a fourth color zone by illuminating the first sub-pixel of the pixel, the second sub-pixel of the pixel, and the third sub-pixel of the pixel.

Example 30 includes the subject matter of Example 29, wherein the control circuitry is to control actuation of the sub-pixels using amplitude modulation.

Example 31 includes a system comprising a display of any one of Examples 1-30 and a video source device coupled to the display.

The invention claimed is:

1. A display comprising:
a display panel comprising a plurality of pixels arranged in rows and columns, the plurality of pixels comprising a first pixel type and a second pixel type, the first pixel type and second pixel type comprising different sub-pixel arrangements and alternating in each row and in each column, wherein:
the first pixel type comprises:
a first sub-pixel to emit a neutral light;
a second sub-pixel to emit a first color light; and
a third sub-pixel to emit a second color light; and
the second pixel type comprises:
a first sub-pixel to emit a neutral light;
a second sub-pixel to emit a third color light; and
a third sub-pixel to emit the second color light.

2. The display of claim 1, wherein the neutral light is substantially white light, the first color light is substantially green light, the second color light is substantially red light, and the third color light is substantially blue light.

3. The display of claim 2, wherein:
the sub-pixels to emit substantially white light and the sub-pixels to emit substantially red light each comprise:
a light emitting diode (LED) that emits substantially blue light;
a color convert material proximate to the LED, the color convert material comprising one of quantum dots or phosphors; and
a color filter above the LED and the color convert material; and
the sub-pixels to emit substantially blue light each comprise a LED that emits substantially blue light and a color filter above the LED.

4. The display of claim 3, wherein the sub-pixels to emit substantially green light each comprise a LED that emits substantially green light and a color filter above the LED.

5. The display of claim 3, wherein the sub-pixels to emit substantially green light each comprise a LED that emits substantially blue light, a color convert material proximate to the LED, and a color filter above the LED.

6. The display of claim 1, further comprising control circuitry to control actuation of the sub-pixels of the display panel to cause each pixel to display a particular color based on input signal from a graphics source, the control circuitry to:
cause a pixel of the first pixel type to:
emit a color in a first color zone by illuminating the first sub-pixel of the pixel, the second sub-pixel of the pixel, and second sub-pixels of one or more neighboring pixels of the second pixel type;
emit a color in a second color zone by illuminating the first sub-pixel of the pixel, the second sub-pixel of the pixel, and the third sub-pixel of the pixel; and
emit a color in a third color zone by illuminating the first sub-pixel of the pixel, the third sub-pixel of the pixel, and second sub-pixels of one or more neigh-
boring pixels of the second pixel type; and
cause a pixel of the second pixel type to:
    emit a color in a first color zone by illuminating the first
        sub-pixel of the pixel, the second sub-pixel of the
        pixel, and second sub-pixels of one or more neigh-
        boring pixels of the first pixel type;
    emit a color in a second color zone by illuminating the
        first sub-pixel of the pixel, the third sub-pixel of the
        pixel, and second sub-pixels of one or more neigh-
        boring pixels of the first pixel type; and
    emit a color in a third color zone by illuminating the
        first sub-pixel of the pixel, the second sub-pixel of
        the pixel, and the third sub-pixel of the pixel.
7. The display of claim 6, wherein the control circuitry is
to control actuation of the sub-pixels using amplitude modu-
lation.
8. A display comprising:
a display panel comprising a plurality of pixels arranged
    in rows and columns, the plurality of pixels comprising
    a first pixel type and a second pixel type, the first pixel
    type and second pixel type comprising different sub-
    pixel arrangements and alternating in each row and in
    each column, wherein:
    the first pixel type comprises:
        a first sub-pixel to emit a neutral light;
        a second sub-pixel to emit a first color light; and
        portions of multiple shared sub-pixels than emit a
            third color light and span multiple pixels of the
            display panel;
    the second pixel type comprises:
        a first sub-pixel to emit the neutral light;
        a second sub-pixel to emit a second color light; and
        portions of multiple shared sub-pixels than emit the
            third color light and span multiple pixels of the
            display panel.
9. The display of claim 8, wherein the portions of the
multiple respective sub-pixels comprise quarters of sub-
pixels located at corners of the pixel and span four pixels of
the display panel.
10. The display of claim 8, wherein the sub-pixels to emit
neutral light, the sub-pixels to emit the first color light, and
the sub-pixels to emit the second color light are the same
size.
11. The display of claim 10, wherein the shared sub-pixels
are a different size than the sub-pixels to emit neutral light,
the sub-pixels to emit the first color light, and the sub-pixels
to emit the second color light.
12. The display of claim 8, wherein the neutral light is
substantially white, the first color light is substantially red,
the second color light is substantially blue, and the third
color light is substantially green.
13. The display of claim 12, wherein:
the sub-pixels to emit substantially white light and the
    sub-pixels to emit substantially red light each comprise:
    a light emitting diode (LED) that emits substantially
        blue light;
    a color convert material proximate to the LED, the
        color convert material comprising one of quantum
        dots or phosphors; and
    a color filter above the LED and the color convert
        material; and
the sub-pixels to emit substantially blue light each com-
    prise a LED that emits substantially blue light and a
    color filter above the LED.

14. The display of claim 13, wherein the sub-pixels to
emit substantially green light each comprise a LED that
emits substantially green light and a color filter above the
LED.
15. The display of claim 13, wherein the sub-pixels to
emit substantially green light each comprise a LED that
emits substantially blue light, a color convert material proxi-
mate to the LED, and a color filter above the LED.
16. The display of claim 8, further comprising control
circuitry to control actuation of the sub-pixels of the display
panel to cause each pixel to display a particular color based
on input signal from a graphics source, the control circuitry
is to:
cause a pixel of the first pixel type to:
    emit a color in a first color zone by illuminating the first
        sub-pixel of the pixel, second sub-pixels of one or
        more neighboring pixels of the second pixel type,
        and the shared sub-pixels whose portions are in the
        pixel;
    emit a color in a second color zone by illuminating the
        first and second sub-pixels of the pixel and the
        shared sub-pixels whose portions are in the pixel;
        and
    emit a color in a third color zone by illuminating the
        first and second sub-pixels of the pixel and second
        sub-pixels of one or more neighboring pixels of the
        second pixel type; and
cause a pixel of the second pixel type to:
    emit a color in a first color zone by illuminating the first
        and second sub-pixels of the pixel and the shared
        sub-pixels whose portions are in the pixel;
    emit a color in a second color zone by illuminating the
        first sub-pixel of the pixel, second sub-pixels of one
        or more neighboring pixels of the first pixel type, and
        the shared sub-pixels whose portions are in the pixel;
        and
    emit a color in a third color zone by illuminating the
        first and second sub-pixels of the pixel and second
        sub-pixels of one or more neighboring pixels of the
        first pixel type.
17. The display of claim 16, wherein the control circuitry
is to control actuation of the sub-pixels using amplitude
modulation.
18. A display comprising:
a display panel comprising a plurality of pixels arranged
    in rows and columns, the plurality of pixels comprising
    a first pixel type and a second pixel type, the first pixel
    type and second pixel type comprising different sub-
    pixel arrangements and alternating in each row and in
    each column, wherein:
    the first pixel type comprises:
        a first sub-pixel to emit a neutral light;
        a second sub-pixel to emit a first color light; and
        a third sub-pixel to emit a second color light; and
    the second pixel type comprises:
        a first sub-pixel to emit the neutral light;
        a second sub-pixel to emit a third color light; and
        a third sub-pixel to emit a fourth color light.
19. The display of claim 18, wherein the neutral light is
substantially white, the first color light is substantially green,
the second color light is substantially red, the third color
light is substantially blue, and the fourth color light is
substantially cyan.
20. The display of claim 19, wherein the sub-pixels to
emit substantially white light and the sub-pixels to emit
substantially red light each comprise:

a light emitting diode (LED) that emits substantially blue light;

a color convert material proximate to the LED, the color convert material comprising one of quantum dots or phosphors; and a color filter above the LED and the color convert material; and the sub-pixels to emit substantially blue light each comprise a LED that emits substantially blue light and a color filter above the LED.

21. The display of claim 20, wherein the sub-pixels to emit substantially green light each comprise a LED that emits substantially green light and a color filter above the LED.

22. The display of claim 20, wherein the sub-pixels to emit substantially green light each comprise a LED that emits substantially blue light, a color convert material proximate to the LED, and a color filter above the LED.

23. The display of claim 16, further comprising control circuitry to control actuation of the sub-pixels of the display panel to cause each pixel to display a particular color based on input signal from a graphics source, the control circuitry is to:

cause a pixel of the first pixel type to:

emit a color in a first color zone by illuminating the first sub-pixel of the pixel, the second sub-pixel of the pixel, and the third sub-pixel of the pixel;

emit a color in a second color zone by illuminating the first sub-pixel of the pixel, the third sub-pixel of the pixel, and second sub-pixels of one or more neighboring pixels of the second pixel type; and emit a color in a third color zone by illuminating the first sub-pixel of the pixel, the second sub-pixel of the pixel, and third sub-pixels of one or more neighboring pixels of the second pixel type;

emit a color in a fourth color zone by illuminating the first sub-pixel of the pixel, second sub-pixels of one or more neighboring pixels of the second pixel type, and third sub-pixels of one or more neighboring pixels of the second pixel type; and cause a pixel of the second pixel type to:

emit a color in a first color zone by illuminating the first sub-pixel of the pixel, second sub-pixels of one or more neighboring pixels of the first pixel type, and third sub-pixels of one or more neighboring pixels of the first pixel type;

emit a color in a second color zone by illuminating the first sub-pixel of the pixel, the second sub-pixel of the pixel, and third sub-pixels of one or more neighboring pixels of the first pixel type;

emit a color in a third color zone by illuminating the first sub-pixel of the pixel, the third sub-pixel of the pixel, and second sub-pixels of one or more neighboring pixels of the first pixel type; and emit a color in a fourth color zone by illuminating the first sub-pixel of the pixel, the second sub-pixel of the pixel, and the third sub-pixel of the pixel.

24. The display of claim 23, wherein the control circuitry is to control actuation of the sub-pixels using amplitude modulation.

* * * * *